(12) United States Patent
Shimizu et al.

(10) Patent No.: US 11,763,890 B2
(45) Date of Patent: Sep. 19, 2023

(54) SEMICONDUCTOR MEMORY DEVICE

(71) Applicant: KIOXIA CORPORATION, Tokyo (JP)

(72) Inventors: Yuki Shimizu, Kamakura Kanagawa (JP); Yoshihiko Kamata, Yokohama Kanagawa (JP); Tsukasa Kobayashi, Machida Tokyo (JP); Hideyuki Kataoka, Kawasaki Kanagawa (JP); Koji Kato, Yokohama Kanagawa (JP); Takumi Fujimoto, Yokohama Kanagawa (JP); Yoshinao Suzuki, Yokohama Kanagawa (JP); Yuui Shimizu, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 93 days.

(21) Appl. No.: 17/409,584

(22) Filed: Aug. 23, 2021

(65) Prior Publication Data
US 2021/0383868 A1 Dec. 9, 2021

Related U.S. Application Data

(62) Division of application No. 16/934,978, filed on Jul. 21, 2020, now Pat. No. 11,133,066, which is a
(Continued)

(30) Foreign Application Priority Data

May 8, 2018 (JP) ................................ 2018-090151

(51) Int. Cl.
*G11C 16/30* (2006.01)
*G11C 16/04* (2006.01)
(Continued)

(52) U.S. Cl.
CPC .......... *G11C 16/0483* (2013.01); *G11C 7/109* (2013.01); *G11C 7/24* (2013.01);
(Continued)

(58) Field of Classification Search
CPC ......... G11C 16/30; G11C 16/28; G11C 16/04; G11C 16/26
See application file for complete search history.

(56) References Cited

U.S. PATENT DOCUMENTS 7,764,547 B2  7/2010 Lee et al.
7,929,344 B2  4/2011 Maejima
(Continued)

FOREIGN PATENT DOCUMENTS

CN    105938726 A    9/2016
JP    2001015718 A    1/2001
(Continued)

OTHER PUBLICATIONS

Chan et al. "Analog Integrated Circuit Design", International Student Version, John Wiley & Sons, 2013, 2nd, pp. 110-111.
(Continued)

*Primary Examiner* — Jason Lappas
(74) *Attorney, Agent, or Firm* — Kim & Stewart LLP

(57) ABSTRACT

A semiconductor memory device includes a substrate, first and second P-type well regions on the substrate, an N-type well region on the substrate and sandwiched between the first and second P-type well regions, a first peripheral circuit on a region of the first P-type well region adjacent to the N-type well region and supplied with a reference voltage via a first wiring, and a second peripheral circuit on a region of the second P-type well region adjacent to the N-type well region and supplied with a reference voltage via a second wiring.

9 Claims, 22 Drawing Sheets

Related U.S. Application Data division of application No. 16/120,298, filed on Sep. 2, 2018, now Pat. No. 10,762,963.

(51) Int. Cl.

| | | |
|---|---|---|
| *G11C 16/08* | (2006.01) | |
| *G11C 16/24* | (2006.01) | |
| *G11C 7/24* | (2006.01) | |
| *G11C 16/10* | (2006.01) | |
| *G11C 7/10* | (2006.01) | |
| *G11C 16/28* | (2006.01) | |

(52) U.S. Cl.
CPC .............. *G11C 16/08* (2013.01); *G11C 16/10* (2013.01); *G11C 16/24* (2013.01); *G11C 16/28* (2013.01); *G11C 16/30* (2013.01)

(56) References Cited

U.S. PATENT DOCUMENTS

| | | |
|---|---|---|
| 9,053,807 B2 | 6/2015 | Hashimoto |
| 9,245,609 B2 | 1/2016 | Aoki |
| 2006/0187733 A1 | 8/2006 | Furuta et al. |
| 2007/0206399 A1 | 9/2007 | Makino et al. |
| 2008/0205111 A1 | 8/2008 | Kajigaya et al. |
| 2008/0225591 A1 | 9/2008 | Hosono et al. |
| 2009/0161433 A1 | 6/2009 | Lee et al. |
| 2010/0007014 A1 | 1/2010 | Suzuki et al. |
| 2011/0012196 A1 | 1/2011 | Williams et al. |
| 2012/0206846 A1 | 8/2012 | Sushihara |
| 2012/0275226 A1* | 11/2012 | Nakamura ............. G11C 16/30 365/185.21 |
| 2016/0260487 A1 | 9/2016 | Maejima |
| 2018/0075912 A1 | 3/2018 | Shimizu et al. |

FOREIGN PATENT DOCUMENTS

| | | |
|---|---|---|
| JP | 2006019647 A | 1/2006 |
| JP | 2006237101 A | 9/2006 |
| JP | 2006302369 A | 11/2006 |
| JP | 2007242736 A | 9/2007 |
| JP | 2008227171 A | 9/2008 |
| JP | 2010021449 A | 1/2010 |
| JP | 2011258292 A | 12/2011 |
| JP | 2012169522 A | 9/2012 |
| JP | 2018045747 A | 3/2018 |

OTHER PUBLICATIONS

Harris et al. "Digital design and computer architecture", Elsevier/Morgan Kaufmann, 2013, 2nd, pp. 372-385.

\* cited by examiner

SEMICONDUCTOR MEMORY DEVICE

CROSS-REFERENCE TO RELATED APPLICATION

This application is a divisional of U.S. patent application Ser. No. 16/934,978, filed Jul. 21, 2020, which is a divisional of U.S. patent application Ser. No. 16/120,298, filed Sep. 2, 2018, now U.S. Pat. No. 10,762,963, issued Sep. 1, 2020, which application is based upon and claims the benefit of priority from Japanese Patent Application No. 2018-090151, filed May 8, 2018, the entire contents of which are incorporated herein by reference.

FIELD

Embodiments described herein relate to a semiconductor memory device.

BACKGROUND

A NAND type flash memory is known as a semiconductor memory device.

DETAILED DESCRIPTION

Figure 1:
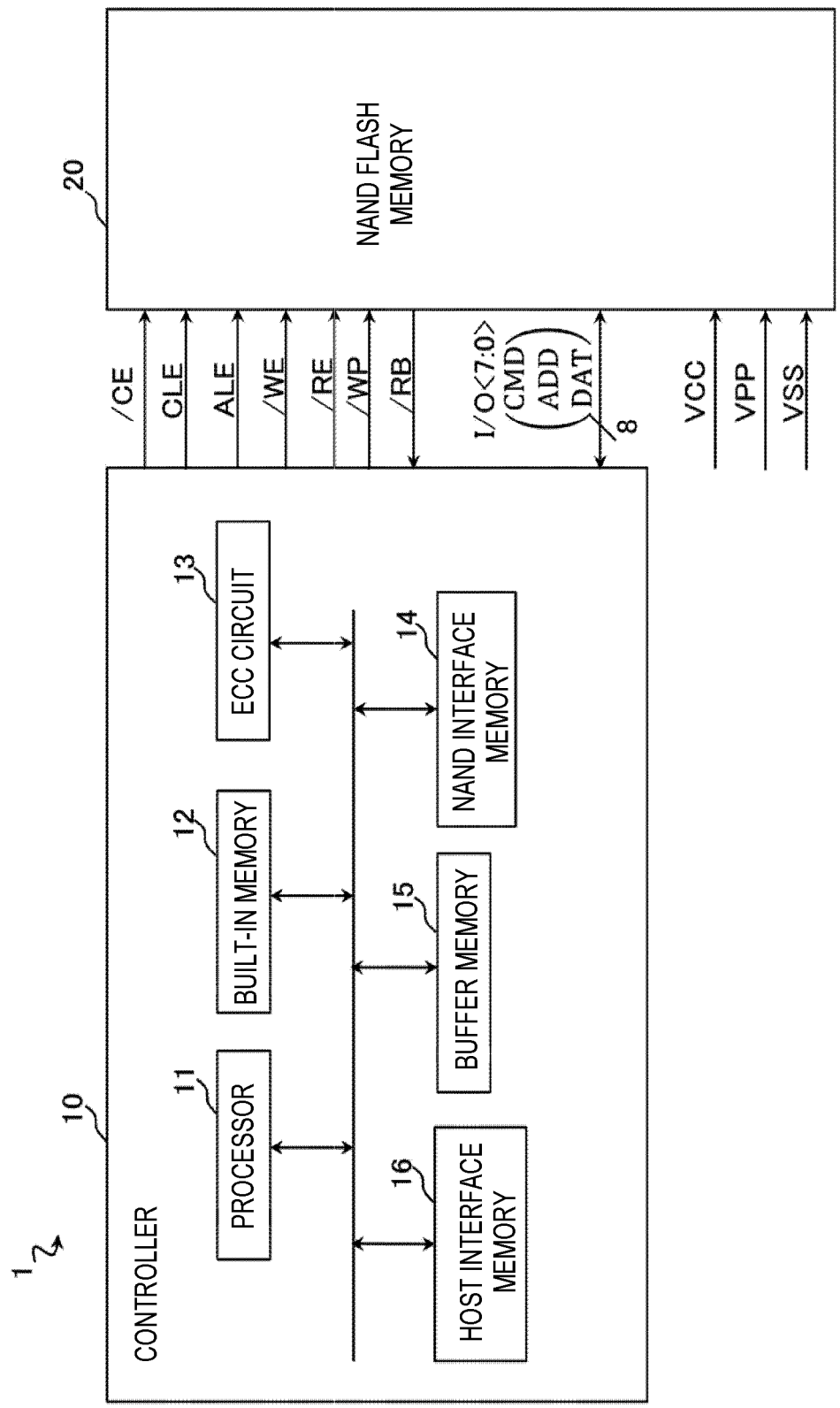
FIG. 1 is a block diagram for explaining a configuration of a memory system according to a first embodiment.

Embodiments provide semiconductor memory devices that reduce noise between planes that operate asynchronously.

In general, according to one embodiment, a semiconductor memory device includes a substrate, first and second P-type well regions on the substrate, an N-type well region on the substrate and sandwiched between the first and second P-type well regions, a first peripheral circuit on a region of the first P-type well region adjacent to the N-type well region and supplied with a reference voltage via a first wiring, and a second peripheral circuit on a region of the second P-type well region adjacent to the N-type well region and supplied with a reference voltage via a second wiring.

Hereinafter, an embodiment of the present disclosure will be described with reference to drawings.

In the following description, the term "connection" also includes a case where elements are electrically connected via a conductive element therebetween.

Further, in the following description, components having the same function and configuration are denoted by common reference numerals. When distinguishing a plurality of components having common reference numerals, a suffix is added to the common reference numerals to distinguish the components. Further, when distinction is not particularly required for a plurality of components, only the common reference numerals are added to the plurality of components, and a suffix is not added.

1. First Embodiment

A semiconductor memory device according to the first embodiment will be described.

1.1 Configuration

First, a configuration of a semiconductor memory device according to the first embodiment will be described.

1.1.1 Overall Configuration of Memory System

FIG. 1 is a block diagram illustrating an example of a configuration of a memory system including a semiconductor memory device according to the first embodiment. A memory system 1 communicates with, for example, an external host device (not illustrated). The memory system 1 stores data from the host device (not illustrated), and reads the data on the host device.

As illustrated in FIG. 1, the memory system 1 includes a controller 10 and a semiconductor memory device (e.g., NAND flash memory) 20. The controller 10 receives a command from the host device and controls the semiconductor memory device 20 based on the received command. Specifically, the controller 10 writes the data instructed to be written from the host device to the semiconductor memory device 20, and reads the data from the semiconductor memory device 20 instructed to be read by the host device and transmits the data to the host device. The controller 10 is connected to the semiconductor memory device 20 by a NAND bus. The semiconductor memory device 20 includes a plurality of memory cells and stores data in a nonvolatile manner.

The NAND bus performs transmitting and receiving signals /CE, CLE, ALE, /WE, /RE, /WP, /RB, and I/O<7:0> according to a NAND interface via individual signal lines. The signal /CE is a signal for enabling the semiconductor memory device 20. The signal CLE notifies the semiconductor memory device 20 that the signal I/O<7:0> that flows to the semiconductor memory device 20 while the signal CLE is at "H (high)" level is a command. The signal ALE notifies the semiconductor memory device 20 that the signal I/O<7:0> that flows to the semiconductor memory device 20 while the signal ALE is at the "H" level is an address. The signal /WE instructs the semiconductor memory device 20 to accept the signal I/O<7:0> that flows to the semiconductor memory device 20 while the signal /WE is at "L (low)" level. The signal /RE instructs the semiconductor memory device 20 to output the signal I/O<7:0>. The signal /WP instructs the semiconductor memory device 20 to prohibit data writing and deleting. The signal /RB indicates whether the semiconductor memory device 20 is in a ready state (a state where a command from the outside can be received) or a busy state (a state where a command from the outside cannot be received). The signal I/O<7:0> is, for example, an 8-bit signal. The signal I/O<7:0> contains data transmitted and received between the semiconductor memory device 20 and the controller 10, and includes a command CMD, an address ADD, and data DAT. The data DAT includes a write data and a read data.

In addition, for example, voltages VCC, VPP, and VSS are supplied as reference voltages from the outside to the semiconductor memory device 20. The voltages VCC and VPP are, for example, power supply voltages for driving the semiconductor memory device 20, and the voltage VSS is, for example, a ground voltage which is smaller than the voltages VCC and VPP.

1.1.2 Configuration of Controller

Continuing with FIG. 1, the controller of the memory system according to the first embodiment will be explained. The controller 10 includes a processor (CPU: Central Processing Unit) 11, a built-in memory (RAM: Random Access Memory) 12, an error check and correction (ECC) circuit 13, a NAND interface circuit 14, a buffer memory 15, and a host interface circuit 16.

The processor 11 controls the overall operation of the controller 10. The processor 11 issues a read command based on the NAND interface standard to the semiconductor memory device 20, for example, in response to a data read command received from the host device. The processor 11 operates in a similar manner for writing and deleting. Further, the processor 11 has a function of executing various arithmetic operations on the read data from the semiconductor memory device 20.

The built-in memory 12 is, for example, a semiconductor memory such as a dynamic RAM (DRAM), and is used as a work area of the processor 11. The built-in memory 12 stores, for example, firmware for managing the semiconductor memory device 20, and various management tables.

The ECC circuit 13 performs an error detection and error correcting processing. More specifically, when writing data, an ECC code is generated for each set of a certain number of data, based on the data received from the host device. Further, when reading data, ECC decoding is performed based on the ECC code, and the presence or absence of an error is detected. When an error is detected, the bit location is specified, and the error is corrected.

The NAND interface circuit 14 is connected to the semiconductor memory device 20 via the NAND bus, and is in charge of communicating with the semiconductor memory device 20. The NAND interface circuit 14 transmits the command CMD, the address ADD, and the write data to the semiconductor memory device 20, according to the instruction of the processor 11. Further, the NAND interface circuit 14 receives the read data from the semiconductor memory device 20.

The buffer memory 15 stores, for example, data received by the controller from the semiconductor memory device 20 and the host device. The buffer memory 15 is also used, for example, as a memory area for temporarily storing read data from the semiconductor memory device 20 and arithmetic operation results on the read data.

The host interface circuit 16 is connected to the host device and is in charge of communicating with the host device. The host interface circuit 16 transmits, for example, an instruction and data received from the host device to the processor 11 and the buffer memory 15, respectively.

1.1.3 Configuration of Semiconductor Memory Device

Figure 2:
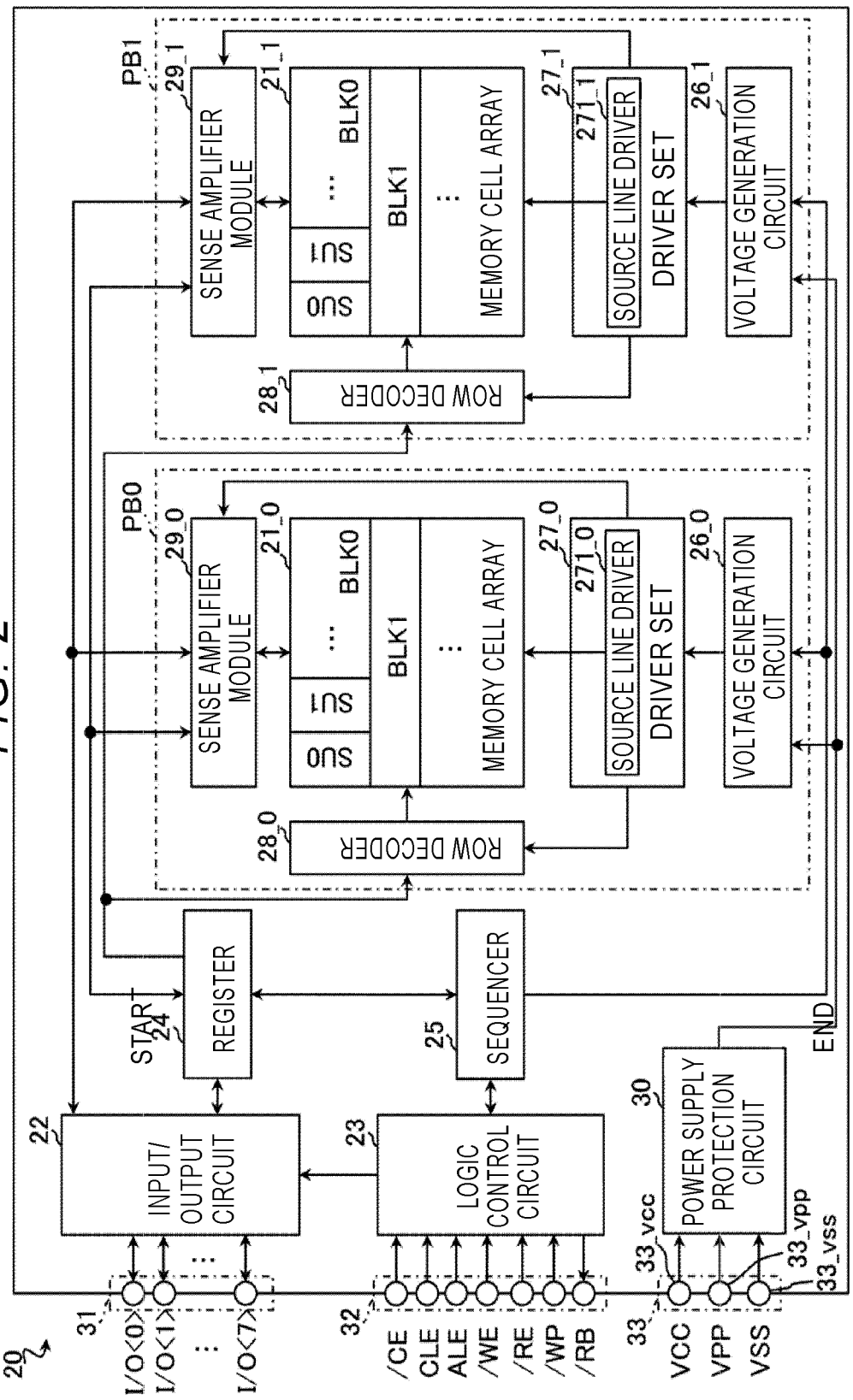
FIG. 2 is a block diagram for explaining a configuration of a semiconductor memory device according to a first embodiment.

Next, an example of a configuration of a semiconductor memory device according to a first embodiment will be described. FIG. 2 is a block diagram illustrating an example of a configuration of a semiconductor memory device according to the first embodiment.

As illustrated in FIG. 2, the semiconductor memory device 20 includes a plurality of planes PB (PB0 and PB1), an input/output circuit 22, a logic control circuit 23, a register 24, a sequencer 25, a power supply protection circuit 30, an input/output pad group 31, a logic control pad group 32, and a power supply pad group 33. The planes PB0 and PB1 include memory cell arrays 21 (21_0 and 21_1), voltage generation circuits 26 (26_0 and 26_1), driver sets 27 (27_0 and 27_1), row decoders 28 (28_0 and 28_1), and sense amplifier modules 29 (29_0 and 29_1), respectively.

Each of the memory cell arrays 21_0 and 21_1 includes a plurality of blocks BLK (BLK0, BLK1 . . . ). Different planes PB include a set of blocks BLK having the same address ADD. The blocks BLK having the same address of the different planes PB are distinguished by specifying one of the planes PB. Each block BLK includes a plurality of nonvolatile memory cell transistors (not illustrated) associated with a word line and a bit line. The block BLK is, for example, an erasing unit of data, and the data in the same block BLK is deleted collectively. Each block BLK includes a plurality of string units SU (SU0, SU1 . . . ). Further, the number of blocks in the memory cell array 21 and the number of string units in one block BLK may be set to any number.

The input/output circuit 22 transmits and receives the signal I/O<7:0> to and from the controller 10. The input/output circuit 22 transfers the command CMD and the address ADD in the signal I/O<7:0> to the register 24. The input/output circuit 22 transmits and receives write data and read data to and from the sense amplifier module 29.

The logic control circuit 23 receives signals/CE, CLE, ALE, /WE, /RE, and /WP from the controller 10. Further, the logic control circuit 23 transfers the signal /RB to the controller 10 and notifies the state of the semiconductor memory device 20 to the outside.

The register 24 stores the command CMD and the address ADD. The register 24 transfers the address ADD to the row decoder 28 and the sense amplifier module 29, and transfers the command CMD to the sequencer 25.

The sequencer 25 receives the command CMD and controls the entire semiconductor memory device 20 according to the sequence, based on the received command CMD. The sequencer 25, for example, may read data from each of the planes PB0 and PB1 in parallel. Further, when the sequencer 25 reads data from each of the planes PB0 and PB1 in parallel, the sequencer 25 is configured to be able to either execute the read operation from the plane PB0 and the read operation from the plane PB1 synchronously with each other or asynchronously.

The voltage generation circuit 26 generates a voltage necessary for operations, for example, writing, reading, erasing of data based on an instruction from the sequencer 25. The voltage generation circuits 26_0 and 26_1 supply the generated voltage to the driver sets 27_0 and 27_1, respectively.

The driver sets 27_0 and 27_1 include a plurality of drivers, respectively, and based on the address from the register 24, supply various voltages from the voltage generation circuit 26_0 to the memory cell array 21_0, the row decoder 28_0, and the sense amplifier module 29_0, and various voltages from the voltage generation circuit 26_1 to the memory cell array 21_1, the row decoder 28_1, and the sense amplifier module 29_1. The driver sets 27_0 and 27_1 include, for example, source line drivers 271 (271_0 and 271_1), respectively. By supplying a predetermined voltage (in the example in FIG. 5, voltage REF (e.g., 1 V)) to the source line at the time of reading data, the source line drivers 271_0 and 271_1 draws in the current flowing through the memory cell arrays 21_1 and 21_1, respectively. The source line driver 271 may be driven by a voltage of any level, without being limited to the voltage REF.

The row decoder 28 receives the row address in the address ADD from the register 24, and, for example, selects the block BLK or the like based on the block address in the row address. Voltages from each of the driver sets 27_0 and 27_1 are transferred to the selected block BLK via the row decoders 28_0 and 28_1.

When reading data, the sense amplifier module 29 senses the read data read from the memory cell transistor to the bit line, and transfers the sensed read data to the input/output circuit 22. When writing data, the sense amplifier module 29 transfers the write data written via the bit line to the memory cell transistor. Further, the sense amplifier module 29 receives the column address in the address ADD from the register 24, and outputs the column data based on the column address.

The power supply protection circuit 30 supplies, for example, the voltages VCC, VPP, and VSS supplied from the outside to the voltage generation circuit 26. When a surge occurs in the voltages VCC and VPP, the power supply protection circuit 30 has a function of supplying a voltage obtained by reducing the surge to the voltage generation circuit 26.

The input/output pad group 31 transfers the signal I/O<7:0> received form the controller 10 to the input/output circuit 22. Further, the input/output pad group 31 transfers the signal I/O<7:0> transmitted form the input/output circuit 22 to the semiconductor memory device 20.

The logic control pad group 32 transfers signals/CE, CLE, ALE, /WE, /RE, and /WP received from the controller 10 to the logic control circuit 23. Further, the logic control pad group 32 transfers the signal /RB transmitted form the logic control circuit 23 to the semiconductor memory device 20.

The power supply pad group 33 transfers the voltages VCC, VPP, and VSS supplied from the outside to the power supply protection circuit 30. More specifically, the power supply pad group 33 includes pads 33_vcc, 33_vpp, and 33_vss. The pads 33_vcc, 33_vpp, and 33_vss supply the voltages VCC, VPP, and VSS to the semiconductor memory device 20 via the power supply protection circuit 30.

Figure 3:
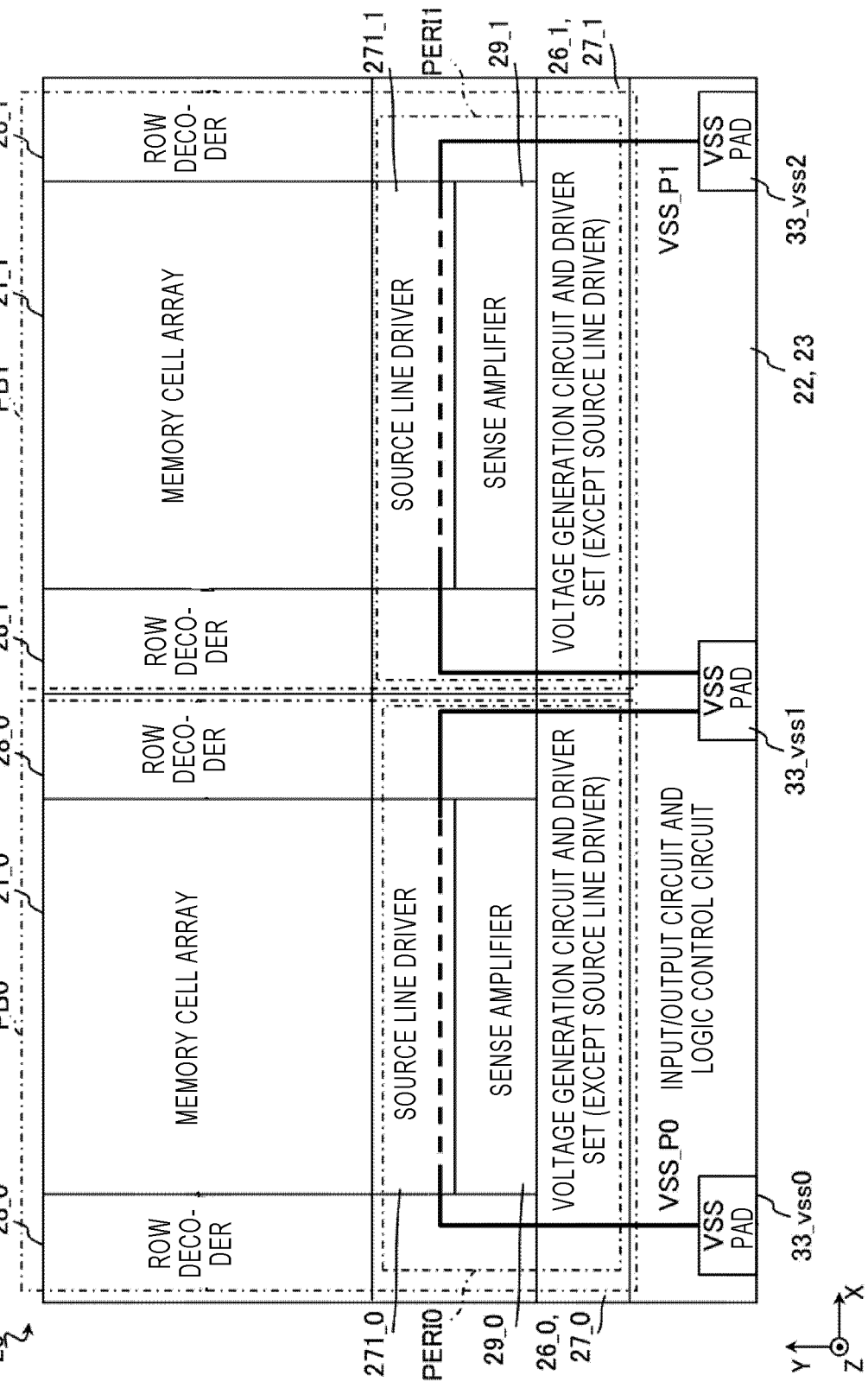
FIG. 3 is a plan view for explaining a layout configuration of a semiconductor memory device according to a first embodiment.

FIG. 3 is a plan view for explaining an outline of a layout of a semiconductor memory device according to the first embodiment. In the following description, it is assumed that the plane parallel to a surface of a semiconductor substrate (not illustrated) on which the semiconductor memory device 20 is provided is the XY plane, and the direction perpendicular to the XY plane is the Z direction. Further, it is assumed that the X direction and the Y direction are orthogonal to each other.

As illustrated in FIG. 3, the planes PB0 and PB1 are, for example, arranged along the X direction. Each plane PB is, for example, provided symmetrically with respect to the Y direction.

The memory cell array 21 is provided in a rectangular shape having, for example, a first side extending in the X direction and a second side extending in the Y direction.

The row decoder 28 is provided, for example, so as to be adjacent to the second side of the memory cell array 21. The row decoder 28 is divided into, for example, two portions, and the two portions sandwich the memory cell array 21 therebetween along the X direction.

The source line driver 271 is provided, for example, so as to be adjacent to the first side of the memory cell array 21.

The sense amplifier module 29 is provided, for example, so as to sandwich the source line driver 271 between the sense amplifier module 29 and the memory cell array 21 along the Y direction.

The voltage generation circuit 26 and the driver set 27 (excluding the source line driver 271) are provided, for example, so as to sandwich the source line driver 271 and the sense amplifier module 29 between the memory cell array 21 and the row decoder 28, along the Y direction.

In the following description, for convenience of explanation, circuits provided in the peripheral area on the memory cell array 21 (e.g., the voltage generation circuit 26, the driver set 27, and the sense amplifier module 29) are referred to as a "peripheral circuit group PERI." More specifically, peripheral circuit groups PERI of the planes PB0 and PB1 are also referred to as "peripheral circuit group PERI0 and PERI1," respectively.

The input/output circuit 22 and the logic control circuit 23 are provided, for example, so as to be adjacent to an area provided with the voltage generation circuit 26 and the driver set 27 (excluding the source line driver 271), along the Y direction.

In the area provided with the input/output circuit 22 and the logic control circuit 23, for example, a plurality of pads 33_vss (33_vss0, 33_vss1, and 33_vss2) is provided. The pads 33_vss0 and 33_vss1 are connected to the source line driver 271_0 via the wiring VSS_P0. The pads 33_vss1 and 33_vss2 are connected to the source line driver 271_1 via the wiring VSS_P1.

Further, the wiring VSS_P0 is connected to the pads 33_vss0 and 33_vss1 by passing through each of the left end and the right end of the plane PB0 so as to avoid the area provided with the voltage generation circuit 26_0, the driver set 27_0 (excluding the source line driver 271_0), and the sense amplifier module 29_0. Similarly, the wiring VSS_P1 is connected to the pads 33_vss1 and 33_vss2 by passing through each of the left end and the right end of the plane PB1 so as to avoid the area provided with the voltage generation circuit 26_1, the driver set 27_1 (excluding the source line driver 271_1), and the sense amplifier module 29_1.

1.1.4 Circuit Configuration of Memory Cell Array

Figure 4:
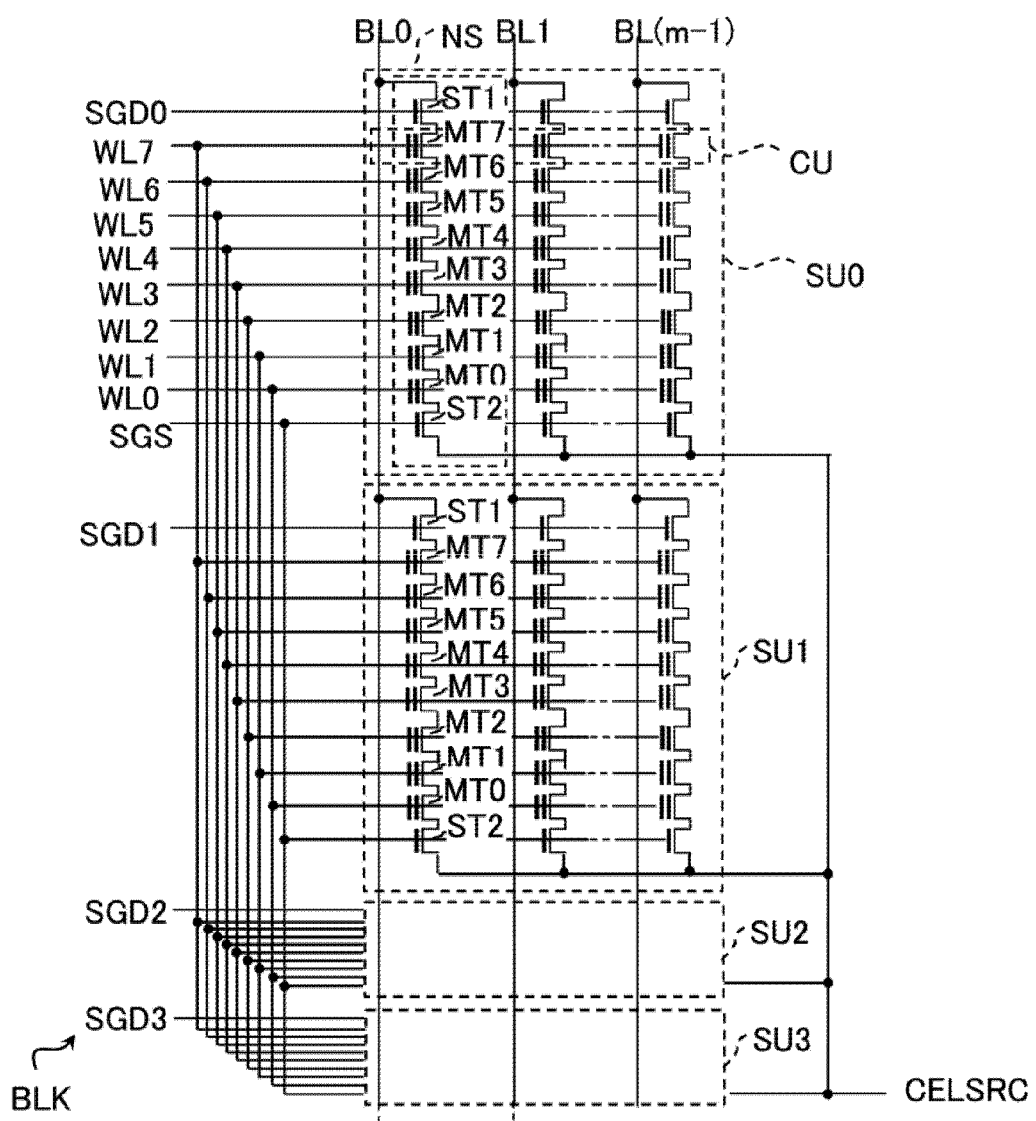
FIG. 4 is a circuit diagram for explaining a configuration of a memory cell array of a semiconductor memory device according to a first embodiment.

Next, a circuit configuration of a memory cell array of a semiconductor memory device according to the first embodiment will be described with reference to FIG. 4. FIG. 4 is an example of a circuit diagram for explaining a configuration of a memory cell array of a semiconductor memory device according to the first embodiment. In FIG. 4, a circuit diagram of one of block BLK of the memory cell array 21 is illustrated.

As illustrated in FIG. 4, each string unit SU is configured with a set of NAND strings NS. Each of the NAND strings NS includes, for example, eight memory cell transistors MT (MT0 to MT7), a select transistor ST1, and a select transistor ST2. Further, the number of memory cell transistors MT is not limited to eight, but may be 16, 32, 64, 96, and 128, etc. The number is not limited. Each of the memory cell transistors MT includes a control gate and a stacked gate including a charge accumulation layer. The memory cell transistors MT are connected in series between the select transistors ST1 and ST2.

In a certain block BLK, gates of the select transistors ST1 in the string units SU0 to SU3 are connected to select gate lines SGD0 to SGD3, respectively. Further, gates of the select transistors ST2 in all the string units SU in the block BLK is commonly connected to the selected gate line SGS. Control gates of the memory cell transistors MT0 to MT7 in the same block BLK are connected to word lines WL0 to WL7, respectively. That is, the word line WL of the same address is commonly connected to all the string units SU in the same block BLK. The selected gate line SGS is commonly connected to all the string units SU in the same block BLK. Meanwhile, the selected gate line SGD is connected to only one of string units SU in the same block BLK.

Further, among the NAND strings NS arranged in a matrix shape in the memory cell array 21, the other end of the select transistor ST1 of the NAND string NS in the same row is connected to one of the m bit lines BL (BL0 to BL(m−1) (m is a natural number). Further, the bit line BL is commonly connected to the NAND string NS in the same column across the plurality of blocks BLK.

In addition, the other end of select transistor ST2 is connected to the source line CELSRC. The source line CELSRC is commonly connected to the plurality of NAND strings NS across the plurality of blocks BLK.

As described above, data erasing is, for example, collectively performed for the memory cell transistors MT in the same block BLK. Meanwhile, reading and writing of data may be collectively performed for the plurality of memory cell transistors MT commonly connected to one of the word lines WL in one of the string units SU of any one of blocks BLK. Such a set of memory cell transistors MT that shares the word line WL in one string unit SU is referred to as, for example, a "cell unit CU." That is, the cell unit CU is a set of memory cell transistors MT on which write or read operation are performed collectively.

Further, one memory cell transistor MT is able to, for example, store a plurality of bit data. In the same cell unit CU, a set of one bits each stored in the same bit position in each of the memory cell transistors MT is called to a "page." That is, the "page" may be defined as a part of the memory space formed in the set of the memory cell transistors MT in the same cell unit CU.

1.1.5 Circuit Configuration of Peripheral Circuit

Figure 5:
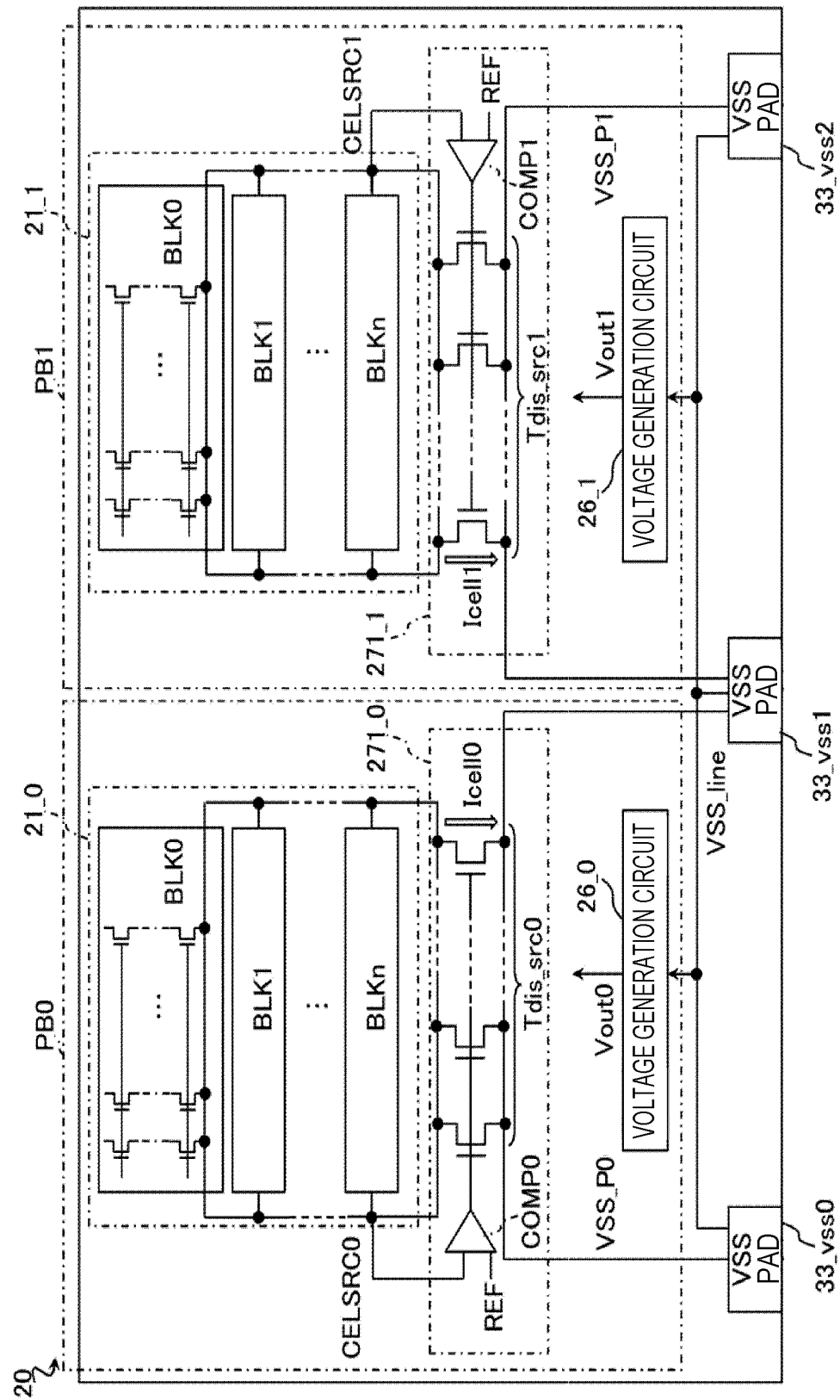
FIG. 5 is a circuit diagram for explaining a configuration of a peripheral circuit of a semiconductor memory device according to a first embodiment.

Next, a circuit configuration of a peripheral circuit of a semiconductor memory device according to the first embodiment will be described. FIG. 5 is an example of a circuit diagram for explaining a configuration of a peripheral circuit of a semiconductor memory device according to the first embodiment. In FIG. 5, a part of the memory cell array 21 and the peripheral circuit group PERI are illustrated, and as an example of a part of the peripheral circuit group PERI, the source line driver 271 and the voltage generation circuit 26 are illustrated.

As illustrated in FIG. 5, the source line drivers 271_0 and 271_1 include comparison circuits COMP (COMP0 and COMP1), and a plurality of transistors Tdis_src (Tdis_src0 and Tdis_src1), respectively.

The comparison circuit COMP0 includes a first input end connected to the source line CELSRC0 corresponding to the plane PB0, a second input end supplied with the reference voltage REF, and an output end commonly connected to the gates of the plurality of transistors Tdis_src0. The plurality of transistors Tdis_src0 includes a first end connected to the source line CELSRC0, a second end connected to the wiring VSS_P0, and a gate connected to the output end of the comparison circuit COMP0.

The reference voltage REF is, for example, supplied from the voltage generation circuit 26_0, and is a voltage for determining whether to electrically connect the source line CELSRC0 and the wiring VSS_P0 or not. That is, when the potential of the source line CELSRC0 is smaller than the reference voltage REF, the comparison circuit COMP0 outputs a signal at the "L" level, and sets the plurality of transistors Tdis_src0 to an OFF state. Meanwhile, when the potential of the source line CELSRC0 is larger than the reference voltage REF, the comparison circuit COMP0 outputs a signal at the "H" level, and sets the plurality of transistors Tdis_src0 to an ON state. As a result, for example, when cell current Icell0 flows to the source line CELSRC0 by reading data from the memory cell array 21_0, and the potential of source line CELSRC0 rises, the source line driver 271_0 sets the plurality of transistors Tdis_src0 to an ON state. Therefore, it is possible to discharge the cell current Icell0 via the wiring VSS_P0, and set the potential of source line CELSRC0 to the predetermined voltage REF.

Similarly, the comparison circuit COMP1 includes a first input end connected to the source line CELSRC1 corresponding to the plane PB1, a second input end supplied with the reference voltage REF, and an output end commonly connected to the gates of the plurality of transistors Tdis_src1. The plurality of transistors Tdis_src1 includes a first end connected to the source line CELSRC1, a second end connected to the wiring VSS_P1, and a gate connected to the output end of the comparison circuit COMP1.

As a result, for example, when cell current Icell1 flows to the source line CELSRC1 by reading data from the memory cell array 21_1, and the potential of source line CELSRC1 rises, the source line driver 271_1 sets the plurality of transistors Tdis_src1 to an ON state. Therefore, it is possible to discharge the cell current Icell1 via the wiring VSS_P1, and set the potential of source line CELSRC1 to the predetermined voltage REF.

Each of the voltage generation circuits 26_0 and 26_1 is supplied with the voltage VSS from the pad 33_vss via wiring VSS_line. As a result, the voltage generation circuits 26_0 and 26_1 are able to output voltages Vout (Vout0 and Vout1) based on the voltage Vss, respectively. The voltages Vout0 and Vout1 are used, for example, in a read operation for reading data from the memory cell arrays 21_0 and 21_1, respectively.

Figure 6:
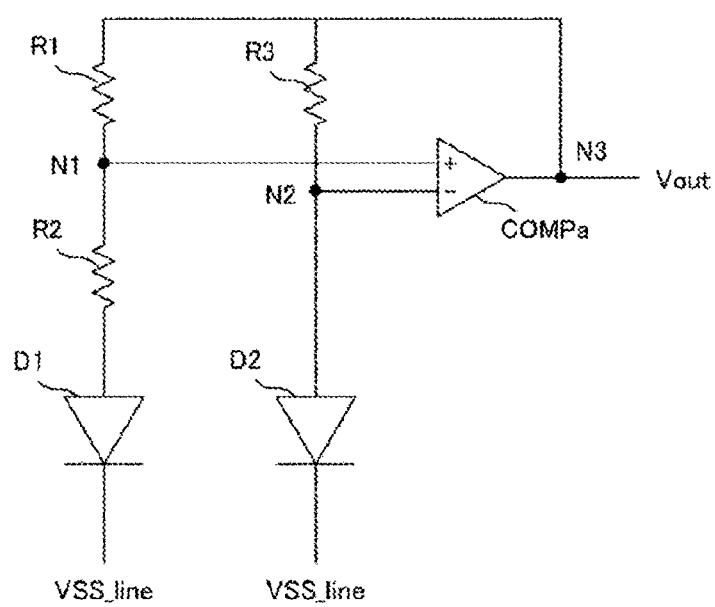
FIG. 6 is a circuit diagram for explaining a first example of a configuration of a voltage generation circuit of a semiconductor memory device according to a first embodiment.
Figure 7:
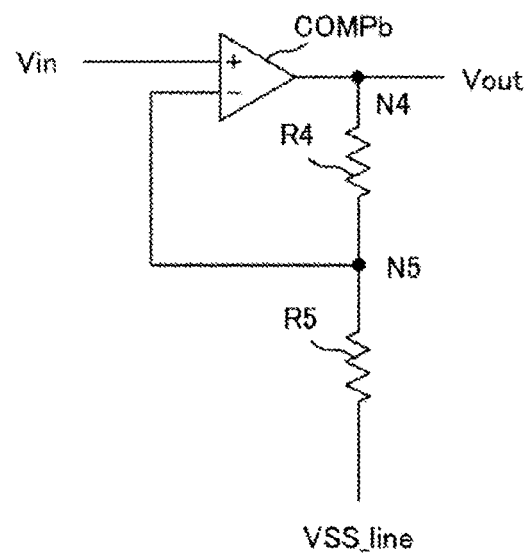
FIG. 7 is a circuit diagram for explaining a second example of a configuration of a voltage generation circuit of a semiconductor memory device according to a first embodiment.

FIGS. 6 and 7 are circuit diagrams for explaining a voltage generation circuit according to the first embodiment. In FIGS. 6 and 7, different circuits that can be employed in the voltage generation circuit 26 is illustrated. More specifically, in FIG. 6, an example of a band gap reference (BGR) circuit is illustrated, and in FIG. 7, an example of an amplifier circuit is illustrated.

First, a case where the BGR circuit is employed in the voltage generation circuit 26, will be described with reference to FIG. 6. As illustrated in FIG. 6, the voltage generation circuit 26 may include resistors R1, R2, and R3, diodes D1 and D2, and a comparison circuit COMPa.

The resistor R1 includes a first end connected to a node N1 and a second end connected to a node N3. The resistor R2 includes a first end connected to a node N1 and a second end connected to an input end of the diode D1. The resistor R3 includes a first end connected to a node N2 and a second end connected to the node N3.

The diode D1 includes an output end connected to the wiring VSS_line. The diode D2 includes an input end connected to the node N2 and an output end connected to the wiring VSS_line. The diode D2 is configured by, for example, connecting a plurality of diodes D1 in parallel.

The comparison circuit COMPa includes a first end connected to the node N1, a second end connected to the node N2, and an output end connected to the node N3. As a result of comparison, the comparison circuit COMPa outputs a voltage, at which the voltages of nodes N1 and N2 become equal, to the node N3.

With the above configuration, the voltage generation circuit 26 is able to output the voltage Vout independent of the power supply voltage from the node N3.

Next, a case where the amplifier circuit is employed in the voltage generation circuit 26, will be described with reference to FIG. 7. As illustrated in FIG. 7, the voltage generation circuit 26 may include resistors R4 and R5 and a comparison circuit COMPb.

The resistor R4 includes a first end connected to a node N4 and a second end connected to a node N5. The resistor R5 includes a first end connected to a node N5 and a second end connected to the wiring VSS_line. The comparison circuit COMPb includes a first end supplied with a voltage Vin, a second end connected to the node N5, and an output end connected to the node N4.

With the above configuration, the voltage generation circuit 26 is able to output the voltage Vout having a value corresponding to the voltage Vin from the node N4.

1.2 Operation

Next, an operation of a semiconductor memory device according to the first embodiment will be described.

Figure 8:
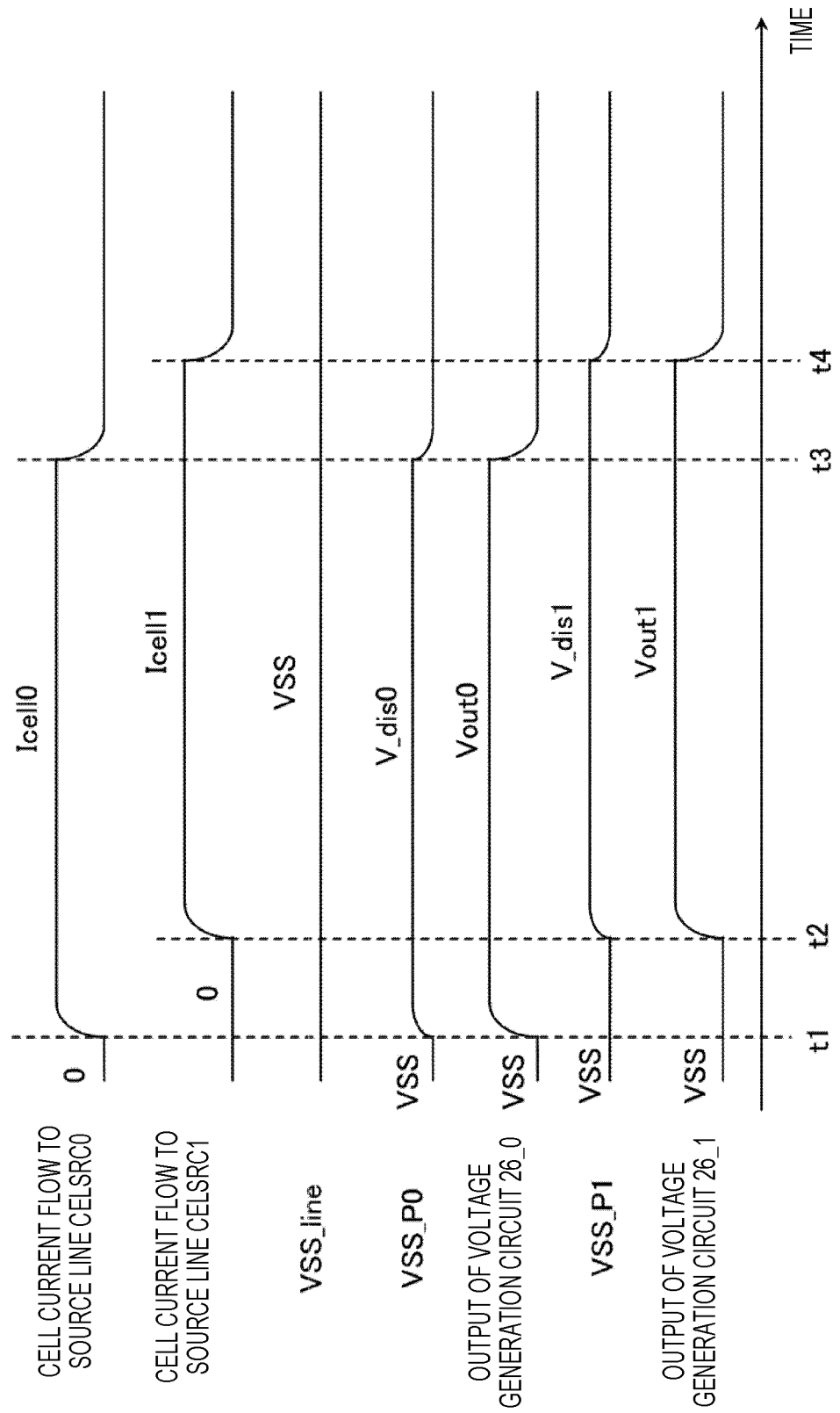
FIG. 8 is a timing chart for explaining a discharge operation of a source line due to asynchronous read operations in a semiconductor memory device according to a first embodiment.

1.2.1 Discharge Operation of Source Line Involved in Asynchronous Read Operations FIG. 8 is a timing chart for explaining a discharge operation of a source line CELSRC involved in asynchronous read operations in a semiconductor memory device according to the first embodiment. FIG. 8 illustrates a relationship between the discharge operation of source lines CELSRC0 and CELSRC1 when mutually asynchronous read operations from the planes PB0 and PB1 are executed in parallel, and output voltages of the voltage generation circuits 26_0 and 26_1 operated according to the asynchronous read. The asynchronous read operations include, for example, a period while data reading from both of the planes PB0 and PB1 is executed and a period while data reading from one of the planes PB0 or PB1 is executed. Further asynchronous read operations are disclosed, for example, in "INPUT CIRCUIT" in Japanese Patent Application No. 2016-180593, filed on Sep. 15, 2016.

As illustrated in FIG. 8, at time t1, the sequencer 25 starts a read operation for the plane PB0. Consequently, the cell current Icell0 flows through the source line CELSRC0 corresponding to the memory cell array 21_0. Since the cell current Icell0 is discharged via the wiring VSS_P0, the potential of wiring VSS_P0 rises to a voltage V_dis0 higher than the voltage VSS under the influence of the discharge.

Further, the sequencer 25 starts an operation of the voltage generation circuit 26_0 according to the read operation of the plane PB0. The voltage generation circuit 26_0 generates and outputs the Vout0 according to the voltage V_dis0 supplied via the wiring VSS_P0.

At the time t1, the sequencer 25 does not perform an operation for the plane PB1. Thus, at the time t1, the cell current does not flow through the source line CELSRC1. Although the wiring VSS_P1 is connected to the wiring VSS_P0 via the pad 33_vss1, it is not affected by the wiring VSS_P0, due to the voltage VSS supplied to the pad 33_vss1 from the outside. Therefore, the potential of the wiring VSS_P1 is maintained at the voltage VSS.

At time t2, the sequencer 25 starts a read operation for the plane PB1. Consequently, the cell current Icell1 flows through the source line CELSRC1 corresponding to the memory cell array 21_1. Since the cell current Icell1 is discharged via the wiring VSS_P1, the potential of wiring VSS_P1 rises to a voltage V_dis1 higher than the voltage VSS under the influence of the discharge.

Further, the sequencer 25 starts an operation of the voltage generation circuit 26_1 according to the read operation of the plane PB1. The voltage generation circuit 26_1 generates and outputs the Vout1 according to the voltage V_dis1 supplied via the wiring VSS_P1.

At the time t2, since the sequencer 25 continuously performs the read operation for the plane PB0, the potential of the wiring VSS_P0 is the voltage V_dis0. Although the wiring VSS_P0 is connected to the wiring VSS_P1 via the pad 33_$vss$1, it is not affected by the wiring VSS_P1, due to the voltage VSS supplied to the pad 33_$vss$1 from the outside. Therefore, the potential of the wiring VSS_P0 is maintained at the voltage V_dis0 without depending on the fluctuation in the potential of the wiring VSS_P1. That is, since the voltage V_dis0 is supplied without depending on the presence or absence of the operation of the plane PB1, the voltage generation circuit 26_0 is able to continuously output the voltage Vout0 without fluctuation.

At time t3, the sequencer 25 terminates the read operation for the plane PB0. Consequently, the cell current flowing through the source line CELSRC0 is stopped, and the potential of the wiring VSS_P0 becomes the voltage VSS. Further, the voltage generation circuit 26_0 terminates the operation in response to the termination of the read operation of the plane PB0.

At the time t3, since the sequencer 25 continuously performs the read operation for the plane PB1, the potential of the wiring VSS_P1 is the voltage V_dis1. Although the wiring VSS_P1 is connected to the wiring VSS_P0 via the pad 33_$vss$1, it is not affected by the wiring VSS_P0, due to the voltage VSS supplied to the pad 33_$vss$0 from the outside. Therefore, the potential of the wiring VSS_P1 is maintained at the voltage V_dis1 without depending on the fluctuation in the potential of the wiring VSS_P0. That is, since the voltage V_dis1 is supplied without depending on the presence or absence of the operation of the plane PB0, the voltage generation circuit 26_1 is able to continuously output the voltage Vout1 without fluctuation.

At time t4, the sequencer 25 starts a read operation for the plane PB1. Consequently, the cell current flowing through the source line CELSRC1 is stopped, and the potential of the wiring VSS_P1 becomes the voltage VSS. Further, the voltage generation circuit 26_1 terminates the operation in response to the termination of the read operation of the plane PB1.

As described above, the discharge operation of the source line involved in the asynchronous read operations is terminated.

1.3 Effect of Embodiment

According to the first embodiment, it is possible to reduce noise between the planes that operate asynchronously. This effect will be described in the following.

When reading data from the memory cell array 21, the cell current Icell flowing through the source line CELSRC0 is on the order of tens of milliamperes (mA). Therefore, while the cell current Icell flows, the potential of the discharge path of the cell current Icell is able to rise from the voltage VSS. As a result, when asynchronous cell current Icell flows between different planes PB, the potential of the discharge path may be varied discontinuously in a case where the read operation is started (or terminated) in one plane PB0 and a case where the read operation is started (or terminated) in the other plane PB1. Here, when the discharge path of the cell current Icell and the supply path of the voltage VSS to the peripheral circuit group PERI are connected to each other, the discontinuous variation of the potential of the discharge path described above may be transferred as a noise voltage to the peripheral circuit group PERI (e.g., the voltage generation circuit 26). In the peripheral circuit group PERI, when the magnitude of the supplied reference voltage is discontinuously varied during the operation, there is a possibility that the output voltage may not be stably output, which is not desirable. More specifically, for example, fluctuation of the reference voltage supplied to the voltage generation circuit 26 may cause the voltage output to the word line WL or the bit line BL to fluctuate during the read operation. Moreover, the number of data to be misread may be increased, which is not desirable.

According to the embodiment, the plurality of transistors Tdis_src0 and pad 33_$vss$ are connected by the wiring VSS_P0, and the plurality of transistors Tdis_src1 and the pad 33_$vss$ are connected by the wiring VSS_P1 different from the wiring VSS_P0. Therefore, it is possible to reduce the influence of mutual interference between the potential variation of the wiring VSS_P0 due to the cell current Icell0 and the potential variation of the wiring VSS_P1 due to the cell current Icell1.

Further, the voltage generation circuits 26_0 and 26_1 and the pad 33_$vss$ are connected by the wiring VSS_line different from the wirings VSS_P0 and VSS_P1. Therefore, it is possible to reduce the influence of the potential variation of the wiring VSS_P0 due to the cell current Icell0 and the potential variation of the wiring VSS_P1 due to the cell current Icell1, on the voltage generation circuit 26. As a result, even when the plane PB1 starts (or terminates) the read operation while the plane PB0 is executing the read operation, the discontinuous fluctuation of the output voltage Vout0 of the voltage generation circuit 26_0 due to the voltage V_dis1 of the wiring VSS_P1 may be prevented. Further, even when the plane PB0 starts (or terminates) the read operation while the plane PB1 is executing the read operation, the discontinuous fluctuation of the output voltage Vout1 of the voltage generation circuit 26_1 due to the voltage V_dis0 of the wiring VSS_P0 may be prevented. Therefore, it is possible to reduce noise between the planes that operate asynchronously.

1.4 First Modification

Further, in the first embodiment, descriptions have been made on the case where the voltage generation circuits 26_0 and 26_1 are connected to the pad 33_$vss$ by the same wiring VSS_line, but the present disclosure is not limited thereto. For example, the voltage generation circuits 26_0 and 26_1 may be connected to the pad 33_$vss$ by wirings different from each other.

Figure 9:
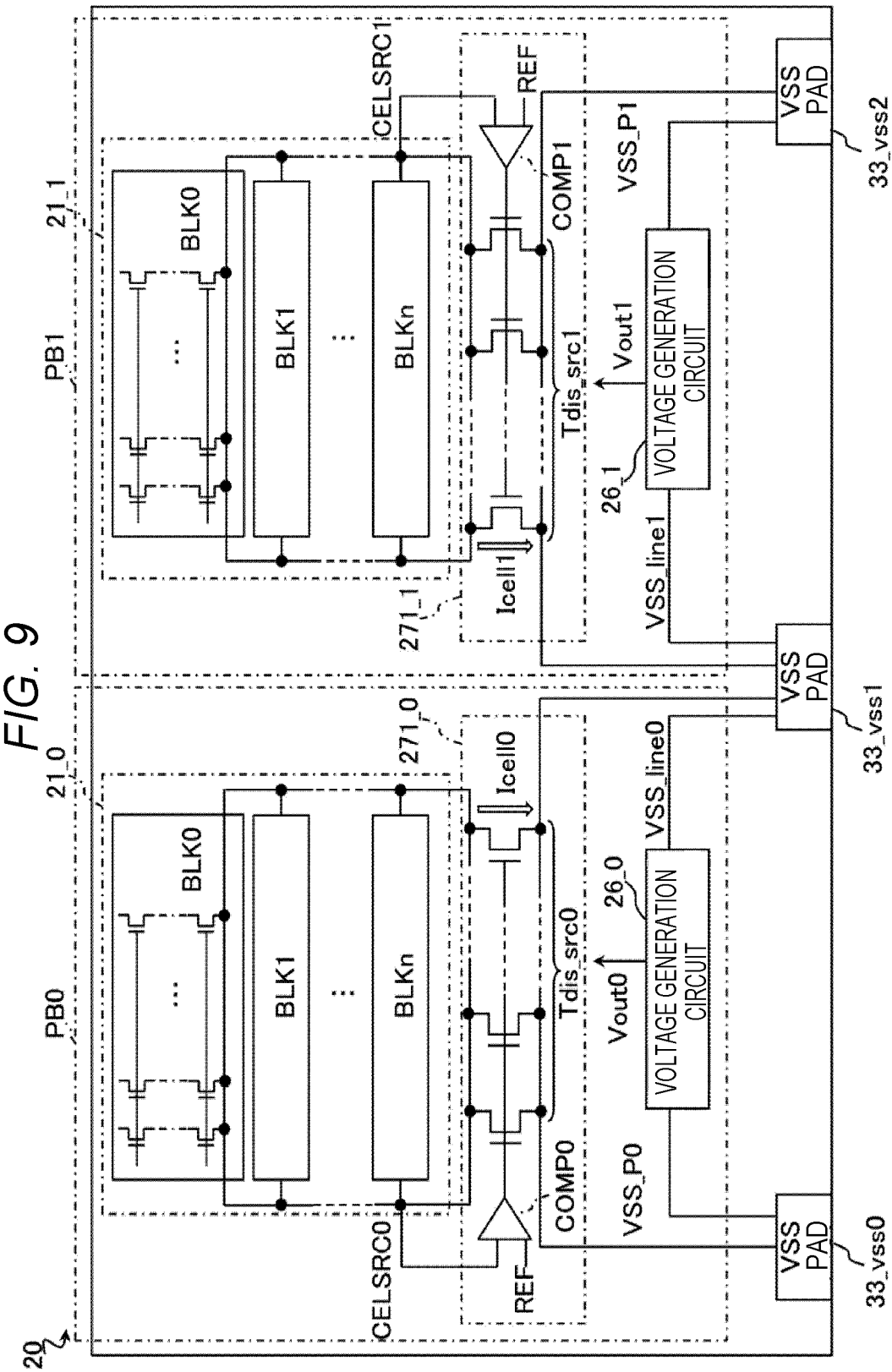
FIG. 9 is a circuit diagram for explaining an example of a configuration of a peripheral circuit of a semiconductor memory device according to a first modification of a first embodiment.
Figure 10:
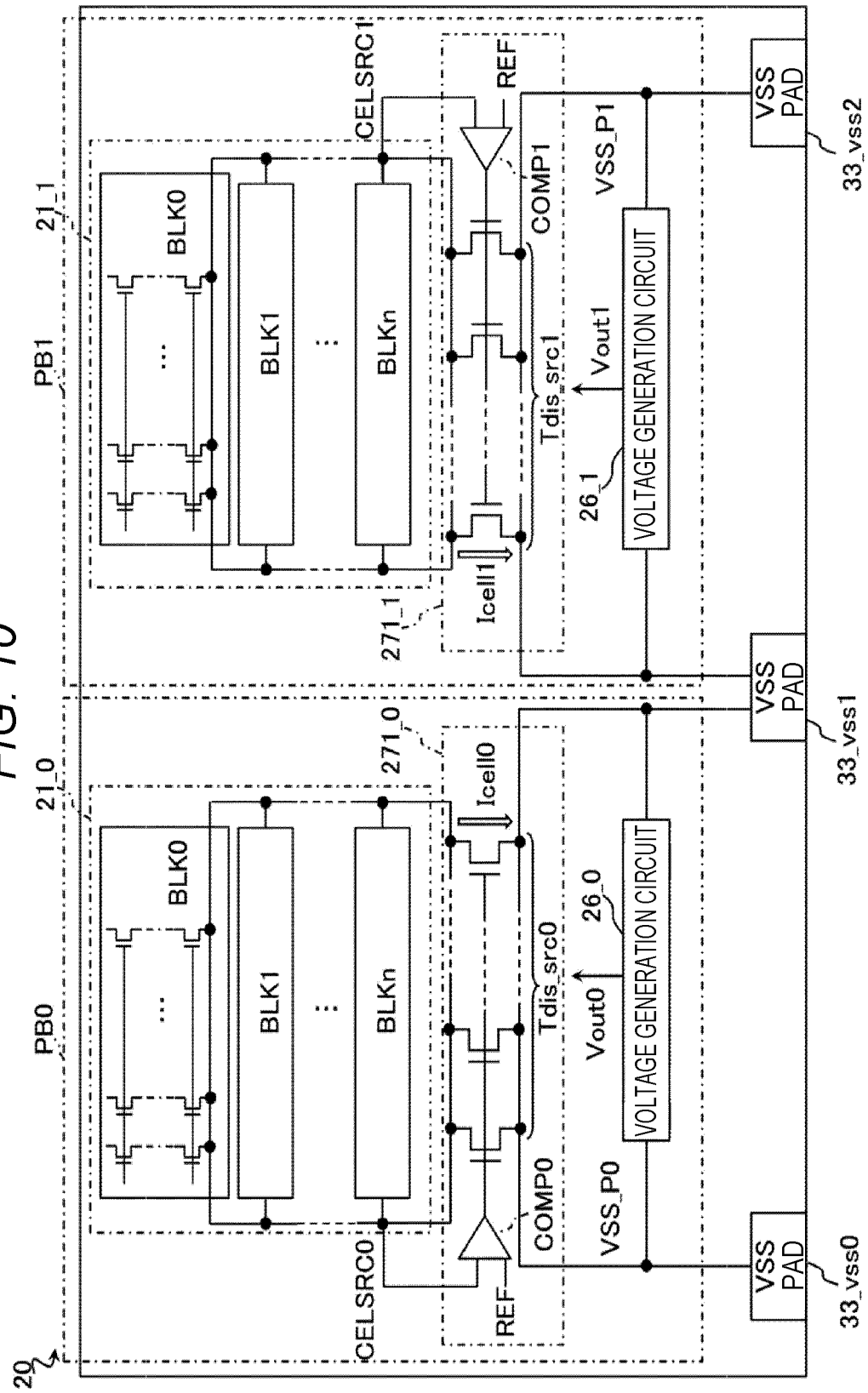
FIG. 10 is a circuit diagram for explaining an example of a configuration of a peripheral circuit of a semiconductor memory device according to a first modification of a first embodiment.

FIGS. 9 and 10 are examples of a circuit diagram for explaining a configuration of a peripheral circuit of a semiconductor memory device according to a first modification of the first embodiment. FIGS. 9 and 10 correspond to FIG. 5 described in the first embodiment.

As illustrated in FIG. 9, the voltage generation circuit 26_0 may be connected to the pads 33_$vss$0 and 33_$vss$1 by a wiring VSS_line0, and the voltage generation circuit 26_1 may be connected to the pads 33_$vss$1 and 33_$vss$2 by a wiring VSS_line1. The wirings VSS_line0 and VSS_line1 are different wirings, and may be different from the wirings VSS_P0 and VSS_P1.

Further, as illustrated in FIG. 10, the voltage generation circuit 26_0 may be connected to the pads 33_$vss$0 and 33_$vss$1 by the wiring VSS_P0, and the voltage generation circuit 26_1 may be connected to the pads 33_$vss$1 and 33_$vss$2 by a wiring VSS_P1.

With the above configuration, as in the first embodiment, when performing asynchronous read operations between different planes PB, the influence of noise voltage generated

1.5 Second Modification

In the first embodiment and the first modification of the first embodiment, descriptions have been made on the case where the noise involved in the discharge operation of the source line CELSRC is reduced, but the present disclosure is not limited thereto. For example, the noise involved in the discharge operation of the word line WL may be reduced.

1.5.1 Configuration of Discharge Path of Word Line

Figure 11:
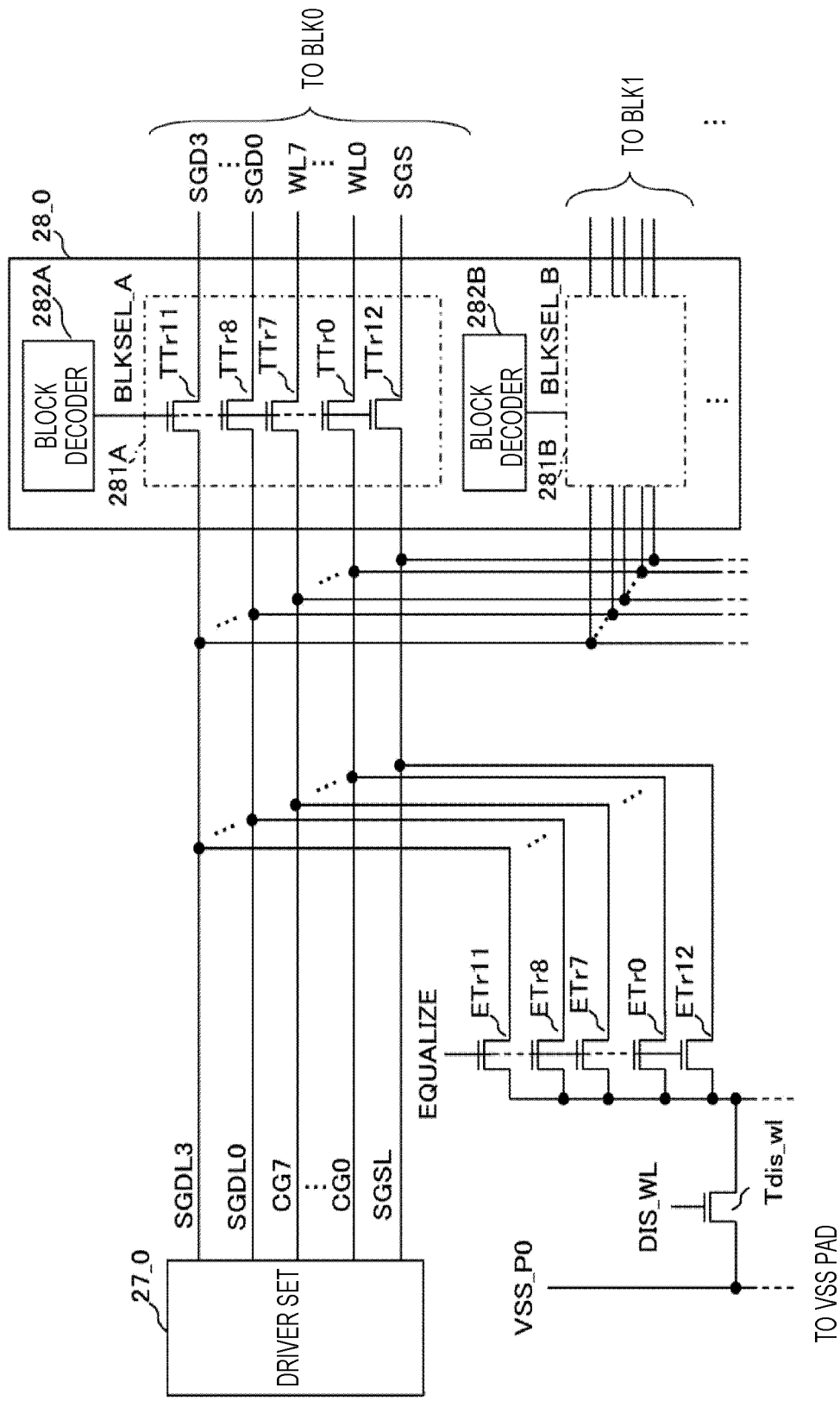
FIG. 11 is a circuit diagram for explaining a configuration of a discharge path of a word line of a semiconductor memory device according to a second modification of a first embodiment.

FIG. 11 is a circuit diagram for explaining a configuration of a discharge path of a word line of a semiconductor memory device according to a second modification of the first embodiment. In FIG. 11, as an example, a configuration of the discharge path of the word line WL in the plane PB0 will be described. The configuration of the discharge path of the word line WL in the plane PB1 is substantially the same as that of the discharge line of the word line WL in the PB0 except that the word line is connected to the VSS_P1 to discharge to the pad 33_vss. Thus, the description thereof will be omitted.

As illustrated in FIG. 11, the row decoder 28_0 includes a plurality of transfer switch groups 281 (281A, 281B . . . ) and a plurality of block decoders 282 (282A, 282B . . . ).

One transfer switch group 281 and one block decoder 282 are allocated, for example, to one block BLK. An example in FIG. 11, the transfer switch group 281A and the block decoder 282A are allocated to the block BLK0, and the transfer switch group 281B and the block decoder 282B are allocated to the block BLK1. In the following description, the block BLK to be a target for writing, reading, and deleting is referred to as "selected block BLK", and the block BLK other than the selected block BLK is referred to as "non-selected block BLK."

The transfer switch group 281 includes, for example, thirteen transfer transistors TTr (TTr0 to TTr12).

The transfer transistors TTr0 to TTr7 transfer the voltages supplied from the driver set 27_0 to the wirings CG (CG0 to CG7) to the word lines WL0 to WL7 of the selected block BLK, respectively. The transfer transistors TTr0 to TTr7 include first ends connected to the word lines WL0 to WL7 of the corresponding block BLK, second ends connected to the wirings CG0 to CG7, and gates commonly connected to nodes BLKSEL, respectively.

The transfer transistors TTr8 to TTr11 transfer the voltages supplied from the driver set 27_0 to wirings SGDL (SGDL0 to SGDL3) to the select gate lines SGD0 to SGD3 of the selected block BLK, respectively. The transfer transistors include first end connected to the select gate lines SGD0 to SGD3 of the corresponding block BLK, second ends connected to the wirings SGDL0 to SGDL3, and gates commonly connected to a node BLKSEL, respectively.

The transfer transistor TTr12 transfers the voltage supplied from the driver set 27_0 to a wiring SGSL to the select gate line SGS of the selected block BLK. The transfer transistor TTr12 include a first end connected to the select gate line SGS of the corresponding block BLK, a second end connected to the wiring SGSL, and a gate connected to a node BLKSEL.

The block decoder 282 decodes the block address signal received from the register 24 at the time of writing, reading, and deleting data. When it is determined that the block BLK corresponding to the block decoder 282 is the selected block BLK as a result of decoding, the block decoder 282 outputs a signal at the "H" level to the node BLKSEL. Further, when it is determined that the corresponding block BLK is not the selected block BLK, the block decoder 282 outputs a signal at the "L" level to the node BLKSEL. The signal output to the node BLKSEL sets the transfer transistors TTR0 to TTr12 to an ON state at the "H" level, and to an OFF state at the "L" level.

With the above configuration, for example, in the transfer switch group 281 corresponding to the selected block BLK, the transfer transistors TTr0 to TTr12 may go into an ON state. Therefore, word lines WL0 to WL7 are respectively connected to the wirings CG0 to CG7, the select gate lines SGD0 to SGD3 are respectively connected to the wirings SGDL0 to SGDL3, and the select gate line SGS is connected to the wiring SGSL.

In addition, in the transfer switch group 281 corresponding to the non-selected block BLK, the transfer transistors TTr0 to TTr12 may go into an OFF state. Therefore, the word line WL is electrically disconnected from the wiring CG, and the select gate lines SGD and SGS are electrically disconnected from the wirings SGDL and SGSL, respectively.

The driver set 27_0 supplies voltages to the wirings CG, SGDL, and SGSL according to the address ADD received from the register 24. The wirings CG, SGDL, and SGSL transfer the various voltages supplied from the driver set 27_0 to the respective transfer switch groups 281A, 281B . . . . That is, the voltages supplied from the driver set 27_0 are transferred to the word line WL and the select gate lines SGD and SGS in the selected block BLK via the transfer transistors TTr0 to TTr12 in the transfer switch group 281 corresponding to the selected block BLK.

The wirings CG, SGDL, and SGSL are further connected to a first end of a transistor Tdis_wl via equalization transfer transistors ETr (ETr0 to Err12) (hereinafter, also simply referred to as a "transfer transistor ETr"). More specifically, the transfer transistors ETr0 to ETr7 include first ends connected to the wirings CG0 to CG7, second ends commonly connected to the first end of the transistor Tdis_wl, and gates commonly supplied with a signal EQUALIZE, respectively. The transfer transistors ETr8 to ETr11 include first ends connected to the wirings SGDL0 to SGDL3, second ends commonly connected to the first end of the transistor Tdis_wl, and gate commonly supplied with a signal EQUALIZE, respectively. The transfer transistor ETr12 includes a first end connected to the wiring SGSL, a second end commonly connected to the first end of the transistor Tdis_wl, and a gate supplied with a signal EQUALIZE.

With the above configuration, the transfer transistor ETr has a function of equalizing the voltages individually supplied to the various wirings CG, SGDL, and SGSL, by going into an ON state.

The transistor Tdis_wl includes a second end connected to the wiring VSS_P0 and a gate supplied with a signal DIS WL. The transistor Tdis_wl functions as a switch that connects the various wirings CG, SGDL, and SGSL and the pad 33_vss via the wiring VSS_P0 by switching between the ON state and the OFF state according to the signal DIS WL.

With the above configuration, the transistor Tdis_wl has a function of discharging the voltages of the various wirings CG, SGDL, and SGSL equalized by the transfer transistor ETr to the pad 33_vss via the wiring VSS_P0.

According to the second modification of the first embodiment, each of the planes PB0 and PB1 is provided with the transistor Tdis_wl individually. The transistor Tdis_wl includes a first end connectable to the word line WL via the transfer transistors ETr and TTr and a second end connected to the pad 33_*vss* via the wiring VSS_P0 (or VSS_P1). Therefore, the voltages supplied to the word line WL in the asynchronous read operations may be discharged via the wiring VSS_P0 (or VSS_P1). As a result, even when the voltage of the word line WL of the plane PB1 is discharged while the plane PB0 is executing the read operation, the discontinuous fluctuation of the output voltage Vout0 of the voltage generation circuit 26_0 due to the voltage V_dis1 of the wiring VSS_P1 may be prevented. Further, even when the voltage of the word line WL of the plane PB0 is discharged while the plane PB1 is executing the read operation, the discontinuous fluctuation of the output voltage Vout1 of the voltage generation circuit 26_1 due to the voltage V_dis0 of the wiring VSS_P0 may be prevented. Therefore, it is possible to reduce noise between the planes that operate asynchronously.

The discharge operation of the word line WL is executed after the read operation is terminated. That is, the discharge operation of the word line WL is executed after the operation of the peripheral circuit group PERI of the corresponding plane PB is terminated. Therefore, as illustrated in FIG. 10 in the first modification of the first embodiment, even in the case where the voltage generation circuits 26_0 and 26_1 are respectively connected to the wirings VSS_P0 and VSS_P1, according to the execution of the discharge operation of the word line WL, the potential of the wiring VSS_P0 is not fluctuated during the execution of the voltage generation circuit 26_0. Thus, it is possible to prevent the discharge operation of the word line WL in the plane PB0 from interfering with the operation of the voltage generation circuit 26_0.

1.6 Third Modification

Descriptions have been made on the case where the noise involved in the discharge operation of the source line CELSRC is reduced is explained in the first embodiment and the first modification of the first embodiment, and the case where the noise involved in the discharge operation of the word line WL is reduced is explained in the second modification of the first embodiment, but the present disclosure is not limited thereto. For example, the noise involved in the discharge operation of the bit line BL may also be reduced.

1.6.1 Configuration of Discharge Path of Bit Line

Figure 12:
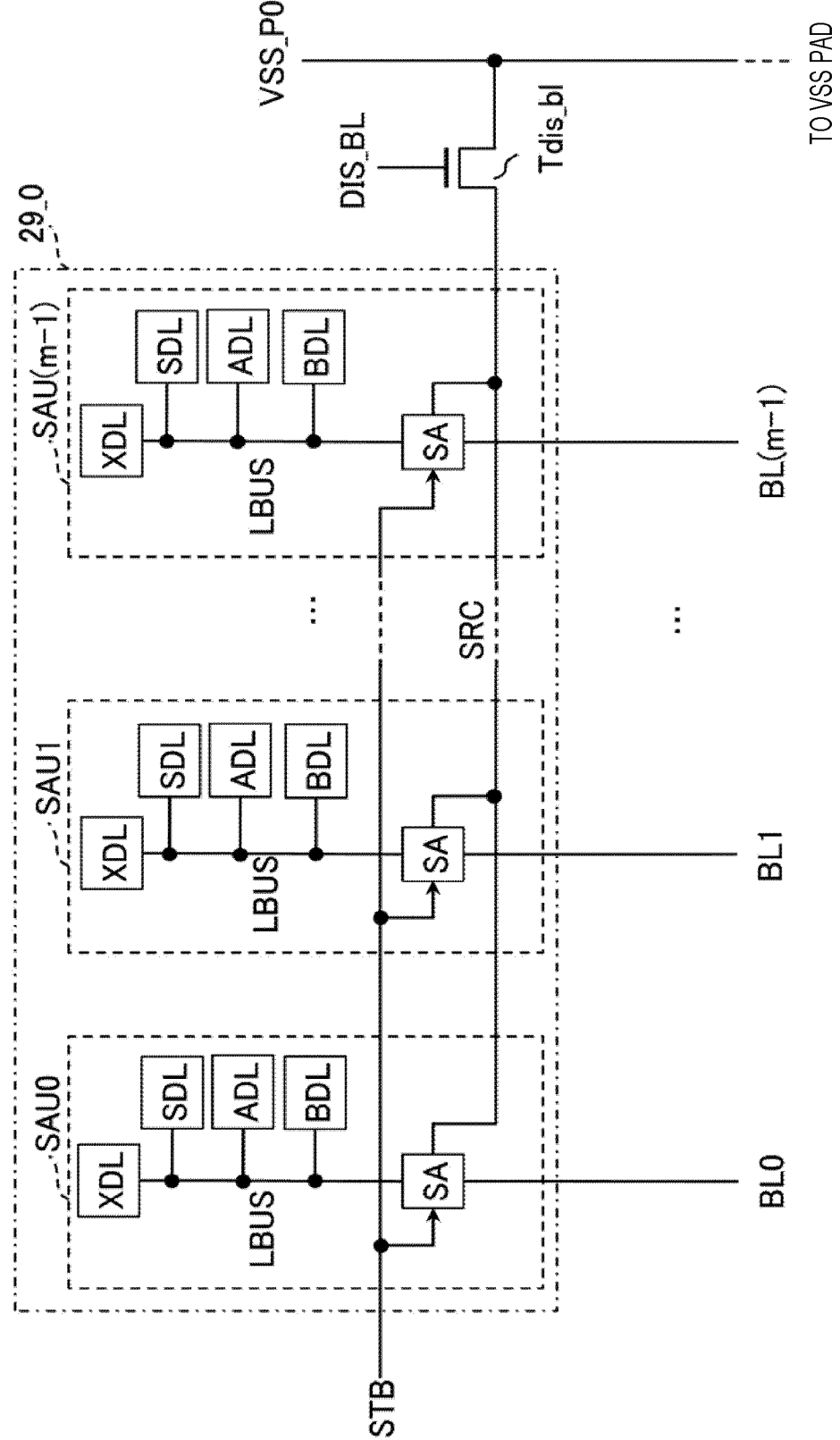
FIG. 12 is a circuit diagram for explaining a configuration of a discharge path of a bit line of a semiconductor memory device according to a third modification of a first embodiment.

FIG. 12 is a circuit diagram for explaining a configuration of a discharge path of a bit line of a semiconductor memory device according to a third modification of the first embodiment. In FIG. 12, as an example, a configuration of the discharge path of the bit line BL in the plane PB0 will be described. Further, a configuration of the discharge path of the bit line BL in the plane PB1 is substantially the same as that of the discharge line of the word line WL in the PB0 except that the word line is connected to the VSS_P1 to discharge to the pad 33_*vss*, the description thereof will be omitted.

As illustrated in FIG. 12, the sense amplifier module 29_0 includes m sense amplifier units SAU (SAU0 to SAU (m−1)) provided in each bit line BL.

Each sense amplifier unit SAU includes, for example, a sense amplifier SA and latch circuits SDL, ADL, BDL, and XDL.

The sense amplifier SA senses data read to the corresponding bit line BL, and also applies a voltage to the bit line BL according to the write data. That is, the sense amplifier SA is a circuit for directly controlling the bit line BL. When reading, for example, a strobe signal STB is given to the sense amplifier SA by the sequencer 25. The sense amplifier SA includes a sense node (not illustrated) for data therein. The potential of the sense node for the data is fluctuated depending on whether the memory cell transistor MT to be read connected to the word line WL goes into an ON state or an OFF state. Then, ON or OFF of the memory cell transistor MT is determined as "0" or "1" data according to the potential of the sense node of data at the timing when the signal STB is asserted. The determined data is stored again in one of latch circuits SDL, ADL, BDL, and XDL.

The latch circuits SDL, ADL, and BDL temporarily store read data and write data. The sense amplifier SA and the latch circuits SDL, ADL, and BDL are connected by a bus LBUS so as to be able to transmit and receive data to and from each other. The bus LBUS is also connected to the latch circuit XDL.

Input and output of data in the sense amplifier module 29_0 is performed via the latch circuit XDL. That is, the data received from the controller 10 is transferred to the latch circuits SDL, ADL, and BDL via the latch circuit XDL. Further, the data of the latch circuits SDL, ADL, and BDL or the sense amplifier SA are transmitted to the controller via the latch circuit XDL. The latch circuit XDL functions as a cache memory of the semiconductor memory device 20. Accordingly, even though the latch circuits SDL, ADL, and BDL are in use, when the latch circuit XDL is empty, the semiconductor memory device 20 may be in ready state.

Each sense amplifier SA connected to the corresponding bit line BL is commonly connected to a first end of a transistor Tdis_bl via the same node SRC. The transistor Tdis_bl includes a second end connected to the wiring VSS_P0 and a gate supplied with a signal DIS_BL. The transistor Tdis_bl functions as a switch that connects the bit line BL and the pad 33_*vss* via the sense amplifier SA and the wiring VSS_P0 by switching between the ON state and the OFF state according to the signal DIS_BL.

With the above configuration, the transistor Tdis_bl has a function of discharging the voltage of the bit line to the pad 33_*vss* via the wiring VSS_P0.

Figure 13:
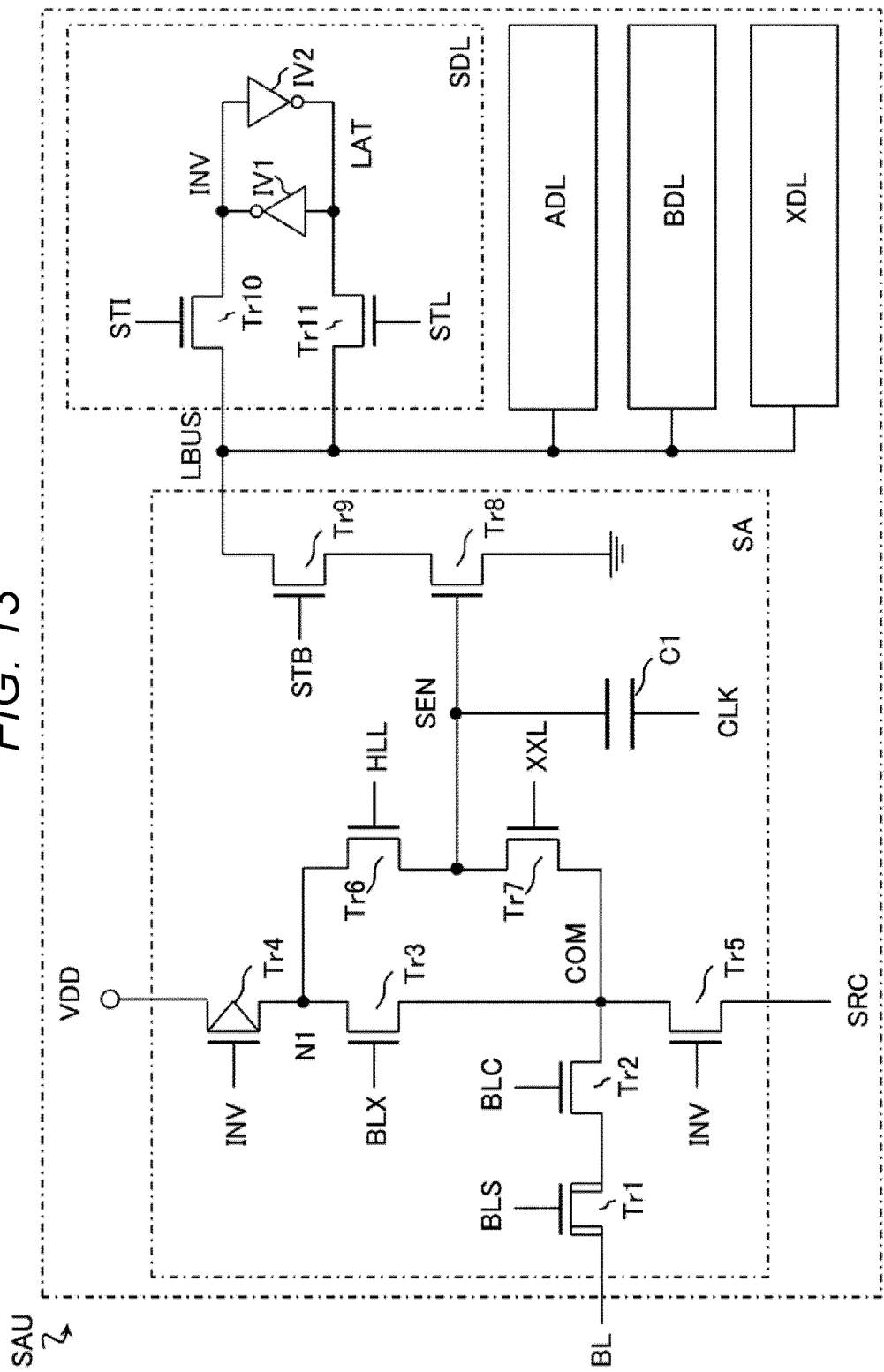
FIG. 13 is a circuit diagram for explaining a configuration of a sense amplifier of a semiconductor memory device according to a third modification of a first embodiment.

FIG. 13 is a circuit diagram for explaining a configuration of a sense amplifier unit of a semiconductor memory device according to the third modification of the first embodiment. In FIG. 13, an example of the connection between the bit line BL and the wiring SRC in the sense amplifier unit SAU in FIG. 12.

As illustrated in FIG. 13, the sense amplifier SA includes, for example, transistors Tr1, Tr2, Tr3, Tr4, Tr5, Tr6, Tr7, Tr8, and Tr9 and a capacitor C1. The latch circuit SDL includes, for example, transistors Tr10 and Tr11 and inverters IV1 and IV2. The transistors Tr1 to Tr3 and Tr5 to Tr11 are N-type transistors, and the transistor Tr4 is a P-type transistor. Further, the latch circuits ADL, BDL, and XDL include, for example, the same configuration as the latch circuit ADL, but the details are omitted in FIG. 13 for convenience of explanation.

The transistor Tr1 includes, for example, a first end connected to the bit line BL, a second end connected to the first end of the transistor Tr2, and a node supplied with a signal BLS. The transistor Tr1 is, for example, a high breakdown voltage transistor, and functions as a switch to supply the voltage of sense amplifier unit SAU to the bit line BL. The transistor Tr2 includes a second end connected to ta node COM and a gate supplied with the signal BLC, and is able to adjust the voltage supplied to the bit line BL to an appropriate value.

The transistor Tr3 includes a first end connected to the node COM, a second end connected to a node N1, and a gate supplied with a signal BLX. The transistor Tr4 includes a first end connected to the node N1, a second end supplied with a voltage VDD, and a gate supplied with a signal INV. The transistor Tr5 includes a first end connected to the node COM, a second end connected to the wiring SRC, and a gate supplied with the signal INV. That is, the transistor Tr4 goes into an ON state and an OFF state when the bit line BL is charged and discharged, and the transistor Tr5 goes into an OFF state and an ON state when the bit line BL is discharged and charged.

The transistor Tr6 includes a first end connected to the node N1, a second end connected to a node SEN, and a gate supplied with a signal HLL. The transistor Tr7 includes a first end connected to the node SEN, a second end connected to the node COM, and a gate supplied with a signal XXL. The capacitor C1 includes a first end connected to the node SEN and a second end supplied with a signal CLK. The node SEN is a sense node described in FIG. 12.

The transistor Tr1 includes a grounded first end, a second end connected to the first end of the transistor Tr9, and a gate connected to the node SEN. The transistor Tr9 includes a second end connected to the bus LBUS and a gate supplied with the signal STB.

The transistor Tr10 includes a first end connected to the bus LBUS, a second end connected to a node supplied with the signal INV, and a gate supplied with a signal STI. The transistor Tr11 includes a first end connected to the bus LBUS, a second end connected to a node LAT, and a gate supplied with a signal STL. The inverter IV1 includes an input end connected to the node LAT and an output end connected to the node supplied with the signal INV. The inverter IV2 includes an input end connected to the node supplied with the signal INV and the output end connected to the node LAT.

According to the third modification of the first embodiment, each of the planes PB0 and PB1 is provided with the transistor Tdis_bl individually. The transistor Tdis_bl includes a first end connectable to the bit line BL via the wiring SRC or the node COM and a second end connected to the pad 33_vss via the wiring VSS_P0 (or VSS_P1). Therefore, the voltage supplied to the bit line BL in the asynchronous read operations may be discharged via the wiring VSS_P0 (or VSS_P1). As a result, even when the voltage of the bit line BL of the plane PB1 is discharged while the plane PB0 is executing the read operation, the discontinuous fluctuation of the output voltage Vout0 of the voltage generation circuit 26_0 due to the voltage V_dis1 of the wiring VSS_P1 may be prevented. Further, even when the voltage of the bit line BL of the plane PB0 is discharged while the plane PB1 is executing the read operation, the discontinuous fluctuation of the output voltage Vout1 of the voltage generation circuit 26_1 due to the voltage V_dis0 of the wiring VSS_P0 may be prevented. Therefore, it is possible to reduce noise between the planes that operate asynchronously.

Further, the discharge operation of the bit line BL is executed after the read operation is terminated. That is, the discharge operation of the bit line BL is executed after the operation of the peripheral circuit group PERI of the corresponding plane PB is terminated. Therefore, as illustrated in FIG. 10 in the first modification of the first embodiment, even in the case where the voltage generation circuits 26_0 and 26_1 are respectively connected to the wirings VSS_P0 and VSS_P1, according to the execution of the discharge operation of bit line BL, the potential of the wiring VSS_P0 is not fluctuated during the execution of the voltage generation circuit 26_0. Thus, it is possible to prevent the discharge operation of the bit line BL in the plane PB0 from interfering with the operation of the voltage generation circuit 26_0.

2. Second Embodiment

Next, a semiconductor memory device according to a second embodiment will be described. In the semiconductor memory device according to the first embodiment, in the asynchronous operations, the case where the noise propagating between planes via wirings is reduced is described. However, the noise voltage may also propagate via substrates, without being limited to the wirings. In the semiconductor memory device according to the second embodiment, in the asynchronous operations, the case where the noise propagating between planes via wirings is reduced is described.

Further, in the second embodiment, the configuration described in the first modification of the first embodiment, that is, the configuration in which the voltages supplied to the peripheral circuit group PERI are separated between the planes PB will be described. In the following, the same components as in the first modification of the first embodiment are denoted by the same reference numerals and the description thereof will be omitted, and different parts from the first modification of the first embodiment will mainly be described.

2.1 Layout Configuration of Substrate

First, a layout configuration of a substrate will be described.

Figure 14:
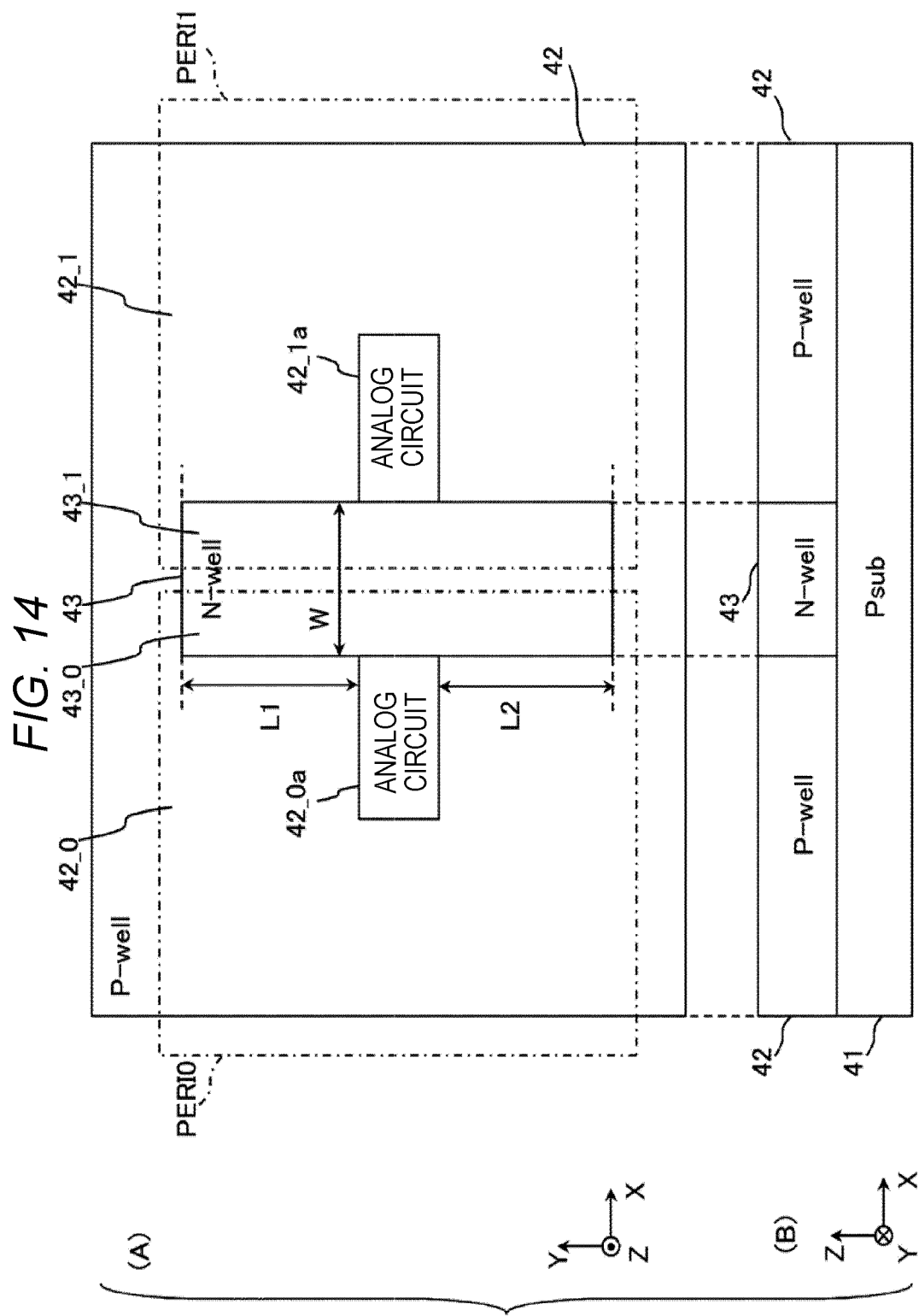
FIG. 14 is a schematic diagram for explaining a layout configuration of a substrate on which a semiconductor memory device according to a second embodiment is provided.

FIG. 14 is a schematic diagram for explaining a layout configuration of a substrate on which a semiconductor memory device according to the second embodiment is provided. Among the substrates, FIG. 14 corresponds to the area where the peripheral circuit groups PERI0 and PERI1 in FIG. 3 described in the first embodiment are provided. Specifically, in (A) in FIG. 14, an example of a planar layout of the substrate on which the peripheral circuit groups PERI0 and PERI1 are provided, and in (B) in FIG. 14, an example of a cross-sectional structure of the substrate on which the peripheral circuit groups PERI0 and PERI1 are provided.

As illustrated in (B) in FIG. 14, on an upper surface of the P-type semiconductor substrate 41 (in the following drawings, the P-type semiconductor substrate 41 is denoted as "Psub"), P-type well regions 42 and an N-type well region 43 (in the following drawings, the P-type well region 42 and the N-type well region 43 are denoted as "P-well" and "N-well", respectively) are formed. The P-type well regions 42 are formed, for example, so as to sandwich the N-type well region 43 therebetween along the X direction.

Further, as illustrated in (A) in FIG. 14, the P-type well regions 42 and the N-type well region 43 are formed, for example, in a substantially rectangular shape extending in the X direction and the Y direction, respectively.

The N-type well region 43 has, for example, a width W along the X direction and is formed across the peripheral circuit groups PERI0 and PERI1. That is, the N-type well region 43 includes a circuit region 43_0 on the N-type well formed in the peripheral circuit group PERI0 and a circuit region 43_1 on the N-type well formed in the peripheral circuit group PERI1. Further, the width W may be a predetermined design value.

The P-type well regions 42 are formed, for example, so as to surround the N-type well region 43. The P-type well regions 42 include, similar to the N-type well region 43, a circuit region 42_0 on the P-type well formed in the peripheral circuit group PERI0 and a circuit region 42_1 on the P-type well formed in the peripheral circuit group PERI1. At a boundary between the circuit region 42_0 on the P-type well and the circuit region 43_0 on the N-type well and at a boundary between the circuit region 42_1 on the P-type well and the circuit region 43_1 on the N-type well, for example, a complementary metal oxide semiconductor (CMOS) may be formed.

Further, on the circuit regions 42_0 and 42_1 on the P-type well, for example, an analog circuit 42_0a is provided in the region adjacent to the circuit region 43_0 on the N-type well, and an analog circuit 42_1a is provided in the region adjacent to the circuit region 43_1 on the N-type well, respectively. Specifically, the analog circuits 42_0a and 42_1a are respectively provided adjacent to the region in the vicinity of the center of the circuit regions 43_0 and 43_1 on the N-type well extending along the Y direction. More specifically, for example, upper and lower ends of the analog circuits 42_0a and 42_1a along the Y direction are provided apart from the upper end of N-type well region 43 by a length L1 along the Y direction and from the lower end of N-type well region by a length L2 along the Y direction. Each of the lengths L1 and L2 is, for example, longer than the width W.

Further, the analog circuits 42_0a and 42_1a are generic names of circuits which are less tolerant to noise from the outside than, for example, digital circuits whose output is defined as "1" or "0." Examples of analog circuits 42_0a and 42_1a include, for example, the voltage generation circuits 26_0 and 26_1 described in the first embodiment, but the present disclosure is not limited thereto, and any analog circuits may be applicable.

With the above configuration, the circuit regions 42_0 and 42_1 on the P-type well are formed while having paths connectable to each other via each of the P-type semiconductor substrate 41, the P-type well region 42, and the N-type well region 43.

2.2 Circuit Configuration of Substrate

Next, a circuit configuration of a substrate will be described.

Figure 15:
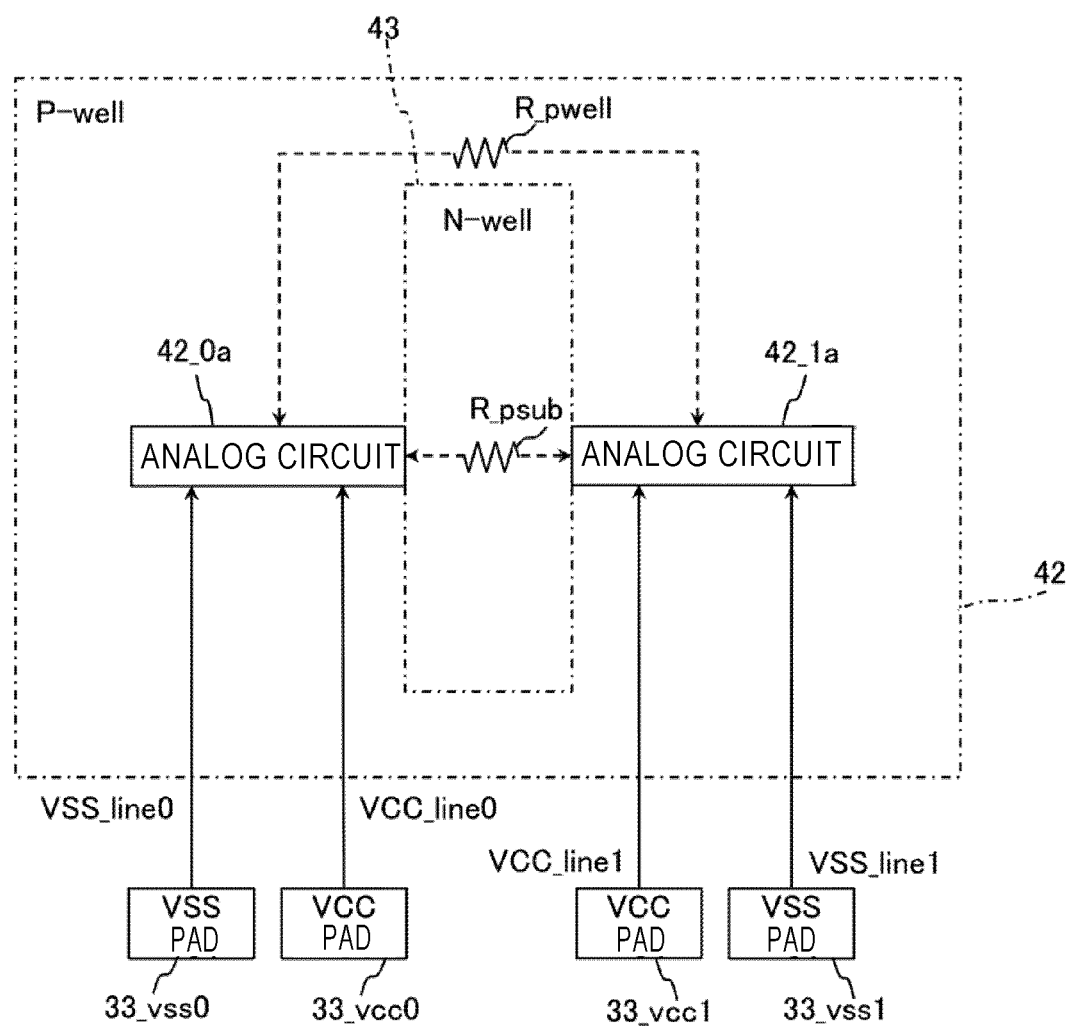
FIG. 15 is a schematic diagram for explaining a circuit configuration of a substrate on which a semiconductor memory device according to a second embodiment is provided.

FIG. 15 is a schematic diagram for explaining a circuit configuration of a substrate on which a semiconductor memory device according to the second embodiment is provided. FIG. 15 schematically illustrates an example of the conductive paths of the analog circuit 42_0a in the peripheral circuit group PERI0 and the analog circuit 42_1a in the peripheral circuit group PERI1, described in FIG. 14. In the example in FIG. 15, a conductive path via wiring (e.g., a metal wiring that has a function of supplying a voltage via a contact (not illustrated) provided on the peripheral circuit group PERI) is indicated by a solid line. Meanwhile, a conductive path via a physical connection other than the wiring (e.g., the P-type semiconductor substrate 41 or the P-type well region 42, etc. electrically connecting the peripheral circuit groups PERI) is indicated by a broken line.

As illustrated in FIG. 15, the analog circuit 42_0a is supplied with, for example, the voltage VSS by being connected to the pad 33_vss0 via the wiring VSS_line0 and the voltage VCC by being connected to the pad 33_vcc0 via the wiring VCC_line0, respectively. The analog circuit 42_1a is supplied with, for example, the voltage VSS by being connected to the pad 33_vss1 via the wiring VSS_line1 and the voltage VCC by being connected to the pad 33_vcc1 via the wiring VCC_line1, respectively. Further, each of the voltage supply paths to the analog circuits 42_0a and 42_1a is not limited to the paths that directly supply the voltages from the pads 33_vcc0 and 33_vcc1, and the like. For example, the analog circuits 42_0a and 42_1a may be supplied with a voltage from a circuit (not illustrated) that generates a voltage based on the voltage VCC.

Further, in the analog circuits 42_0a and 42_1a, the noise voltage caused by the voltage output when one circuit is operated may be input to the other circuit. Specifically, for example, the analog circuits 42_0a and 42_1a may be supplied with a noise voltage corresponding to a parasitic resistance R_psub of the P-type semiconductor substrate 41, via the P-type semiconductor substrate 41 directly below the N-type well region 43. Further, for example, the analog circuits 42_0a and 42_1a may be supplied with a noise voltage corresponding to a parasitic resistance R_pwell of the P-type well region 42, via the P-type well region 42 surrounding the N-type well region 43.

When the width W is predetermined, the parasitic resistance R_pwell may be increased as the lengths L1 and L2 increase. Here, it is known that the resistance per unit length of the P-type semiconductor substrate 41 is about k times (k is a real number larger than 1) than the resistance per unit length of the P-type well region 42. Therefore, for example, when the smaller one of the lengths L1 and L2 is assumed to the length L (L=min(L1, L2)), in order to set the parasitic resistance R_pwell to the same order as the parasitic resistance R_psub, the length L may have a length that satisfies $((2L+W)/W) \geq k$.

The N-type well region 43 may be biased, for example, to a voltage higher than the voltage VSS and the P-type well region 42 may be biased to the voltage VSS. In this case, a reverse bias resistance is generated on the PN junction surface between the N-type well region 43 and the P-type well region 42. The reverse bias resistance is very large with respect to the parasitic resistances R_psub and R_pwell. Therefore, the noise voltage supplied to the analog circuits 42_0a and 42_1a via the N-type well region 43 is negligibly smaller than the noise voltage supplied via the above two paths.

2.3 Effect of Embodiment

According to the second embodiment, the P-type well region 42 and the N-type well region 43 are provided on the P-type semiconductor substrate 41. The N-type well region 43 is provided between the circuit region 42_0 on the P-type well and circuit region 42_1 on the P-type well. The analog circuits 42_0a and 42_1a are supplied with the voltage VSS via the different wirings VSS_line0 and VSS_line1 and the voltage VCC via the wirings VCC_line0 and VCC_line1, from the outside. That is, the analog circuits 42_0a and 42_1a are configured such that the voltages are not supplied by the same wiring. Therefore, it is possible to reduce the noise voltage generated by the operation of one analog circuit 42_0a from being supplied to the other analog circuit 42_1a via the wiring.

Further, since the N-type well region 43 is provided between the analog circuits 42_0a and 42_1a, the paths on the substrate which is able to propagate the noise voltage is limited to a path A via the P-type semiconductor substrate 41 and a path B on the P-type well region 42 surrounding the N-type well region 43. Here, the resistance per unit length of the P-type semiconductor substrate 41 is about k times than the resistance per unit length of the P-type well region 42. Therefore, the path A may suppress the noise voltage to about 1/k times the path via the P-type well region having the same length as the path A. Further, in the path B, the propagation path length is longer than the width W by ((2L+W)/W) times. Therefore, by setting the length L to an appropriate length with respect to the width W, it is possible to reduce the noise voltage via the path B to about the same magnitude as the noise voltage via the path A. Accordingly, it is possible to reduce the noise voltage via the substrate.

As another first method for reducing the noise voltage via the substrate, for example, it is conceivable to provide a method for separating the side surface and the lower surface of each of the circuit regions 42_0 and 42_1 on the P-type well from the P-type semiconductor substrate 41 and other P-type well regions by surrounding the side surface and the lower surface with the N-type well region. According to the second embodiment, the circuit regions 42_0 and 42_1 on the P-type well may be formed on the upper surface of the P-type semiconductor substrate 41. Therefore, a process in which the N-type well region is provided between each of the circuit regions 42_0 and 42_1 on the P-type well and the P-type semiconductor substrate 41 is unnecessary, and the process cost may be reduced as compared with the other method described above.

Further, as another second method for reducing the noise voltage via the substrate, for example, it is conceivable to provide a method for separating the circuit regions 42_0 and 42_1 on the P-type well to such a degree that the noise voltage is ignorable, without providing the N-type well region 43 between the circuit regions 42_0 and 42_1 on the P-type well. According to the second embodiment, by providing the N-type well region 43, the P-type semiconductor substrate 41 may be used as a propagation path of the noise voltage. Therefore, it is possible to shorten the distance between the circuit regions 42_0 and 42_1 on the P-type well as compared with another second method described above, and further, it is able to prevent an increase in the circuit area.

Further, in the N-type well region 43, circuits respectively corresponding to the peripheral circuit groups PERI0 and PERI1 are provided on the circuit regions 43_0 and 43_1 on the N-type well. Therefore, the N-type well region 43 may be used not only as a barrier for suppressing the noise voltage, but also as a circuit region. As a result, an increase in the circuit area may be prevented.

2.4 First Modification

In the second embodiment, descriptions have been made on the case where one N-type well region 43 is provided between the circuit regions 42_0 and 42_1 on the P-type well, but the present disclosure is not limited thereto. For example, a plurality of N-type well regions may be provided between the circuit regions 42_0 and 42_1 on the P-type well. In the following, the same components as in the second embodiment are denoted by the same reference numerals and the description thereof will be omitted, and different parts from the second embodiment will mainly be described.

Figure 16:
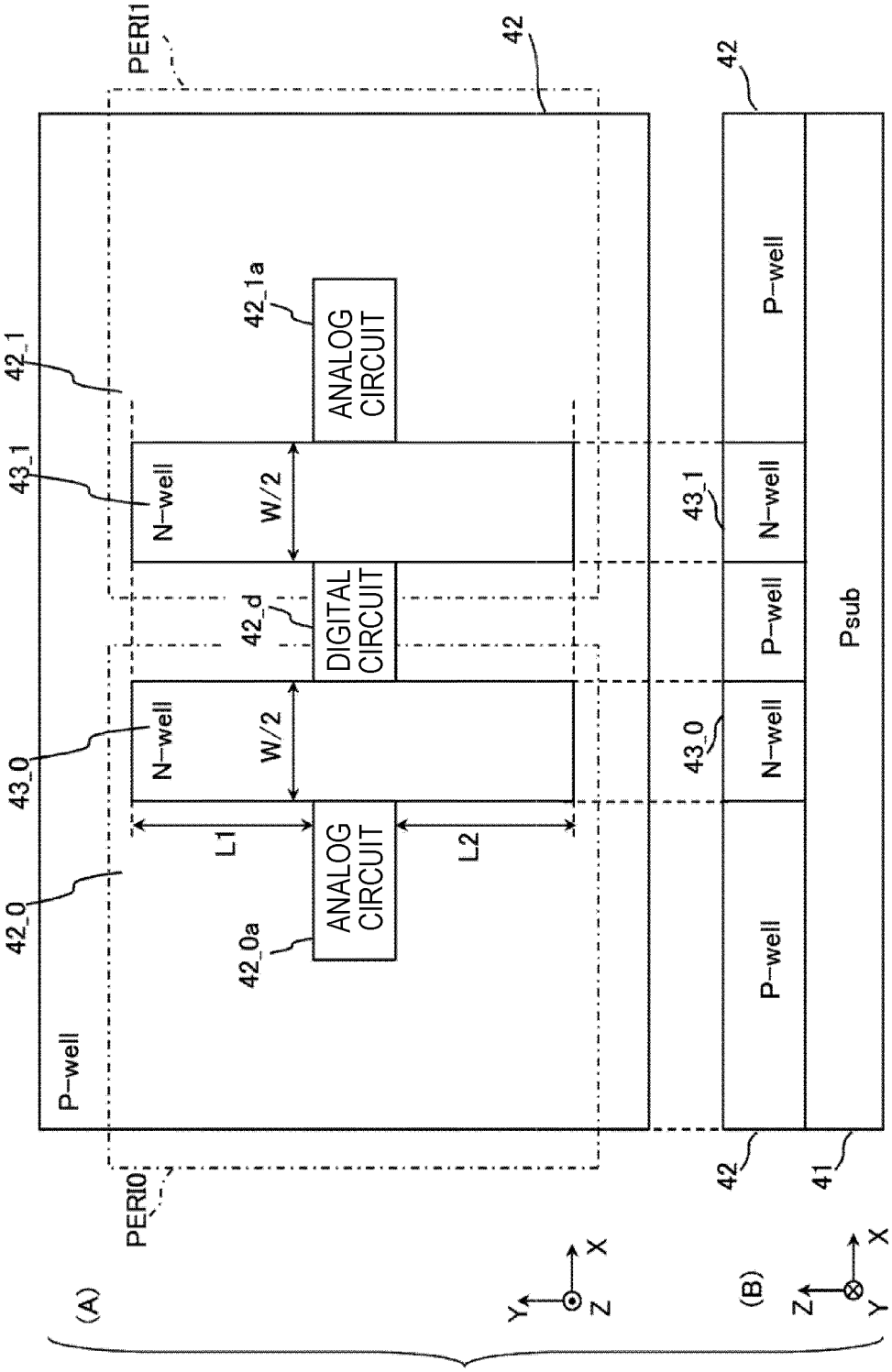
FIG. 16 is a schematic diagram for explaining a layout configuration of a substrate on which a semiconductor memory device according to a first modification of a second embodiment is provided.

FIG. 16 is a schematic diagram for explaining a layout configuration of a substrate on which a semiconductor memory device according to the first modification of the second embodiment is provided. FIG. 16 corresponds to FIG. 14 described in the second embodiment. More specifically, in (A) in FIG. 16, an example of a planar layout of the substrate on which the peripheral circuit groups PERI0 and PERI1 are provided, and in (B) in FIG. 16, an example of a cross-sectional structure of the substrate on which the peripheral circuit groups PERI0 and PERI1 are provided.

As illustrated in (b) in FIG. 16, the circuit regions 43_0 and 43_1 on the N-type well are formed separately from each other along the X direction. That is, each of the circuit regions 43_0 and 43_1 on the N-type well is formed so as to have a width W/2 along the X direction and to be sandwiched between the P-type well regions 42.

Further, as illustrated in (A) in FIG. 16, the circuit regions 43_0 and 43_1 on the N-type well are formed in the peripheral circuit groups PERI0 and PERI1, respectively. That is, the circuit regions 43_0 and 43_1 on the N-type well are surrounded by the circuit region 42_0 on the P-type well formed in the peripheral circuit group PERI0 and the circuit region 42_1 on the P-type well formed in the peripheral circuit group PERI1.

Further, for example, a digital circuit 42_d may be provided in a region of the circuit regions 42_0 and 42_1 on the P-type well formed between the circuit regions 43_0 and 43_1 on the N-type well. In addition, a circuit provided in the region is not limited to a digital circuit, but any circuit may be provided as long as the circuit itself is not a noise source to the analog circuits 42_0a and 42_1a, and the circuit has high noise tolerance from other peripheral circuits.

Figure 17:
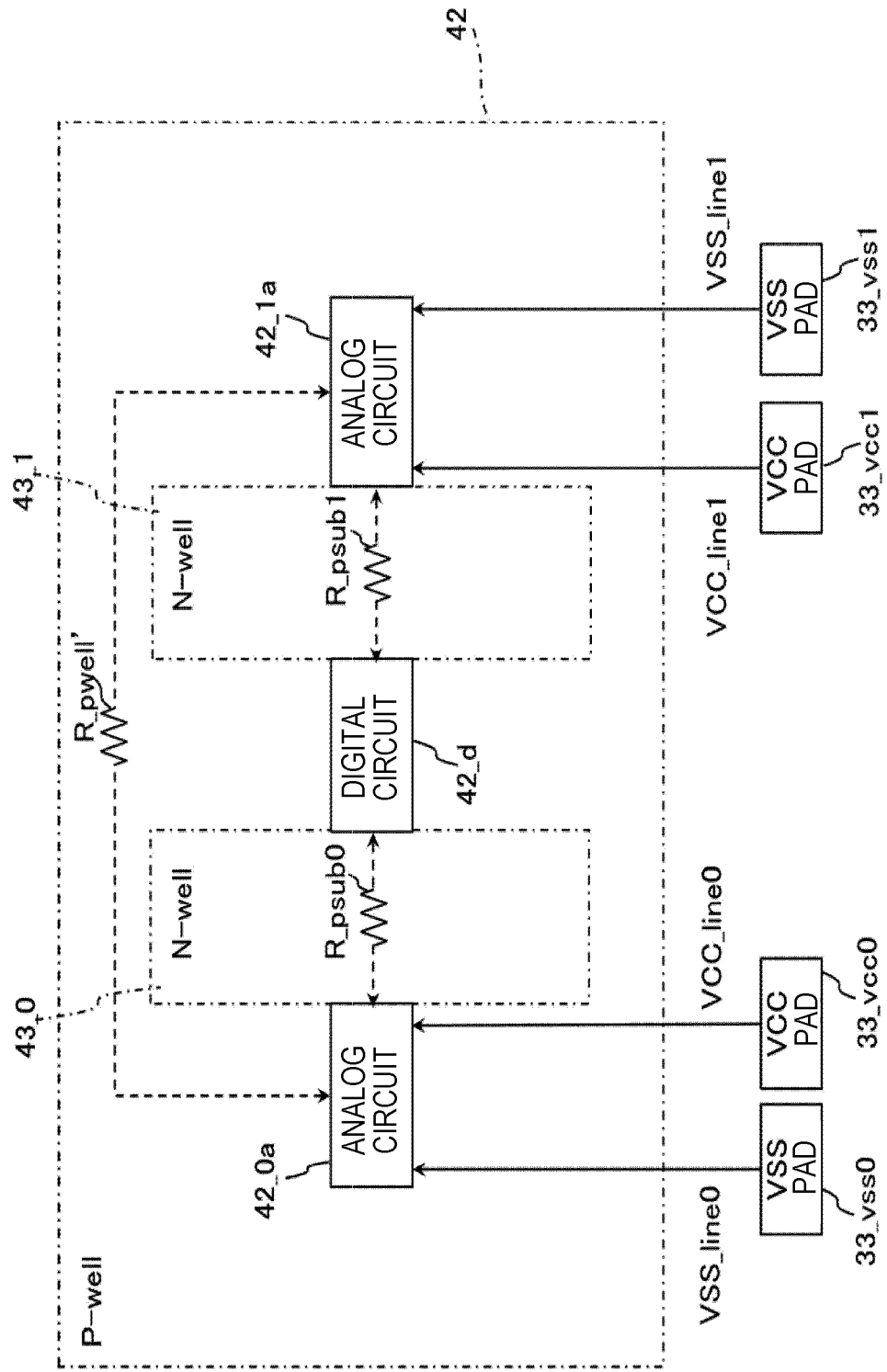
FIG. 17 is a schematic diagram for explaining a circuit configuration of a substrate on which a semiconductor memory device according to a first modification of a second embodiment is provided.

FIG. 17 is a schematic diagram for explaining a circuit configuration of a substrate on which a semiconductor memory device according to a first modification of a second embodiment is provided. FIG. 17 corresponds to FIG. 15 described in the second embodiment.

As illustrated in FIG. 17, the P-type semiconductor substrate 41 includes a parasitic resistance R_psub0 between the analog circuit 42_0a and the digital circuit 42_d and a parasitic resistance R_psub1 between the analog circuit 42_1a and the digital circuit 42_d. Therefore, the analog circuits 42_0a and 42_1a may be supplied with a noise voltage corresponding to a parasitic resistance (R_psub0+R_psub1) via the P-type semiconductor substrate 41 directly below the N-type well region 43. When the size of each of the circuit regions 43_0 and 43_1 on the N-type well is about a half of that of the N-type well region 43 in the second embodiment, the parasitic resistance (R_psub0+R_psub1) may be set to the same degree as the parasitic resistance R_psub.

Further, for example, the P-type well region 42 includes a parasitic resistance R_pwell' between the analog circuit 42_0a and the analog circuit 42_1a. Therefore, the analog circuits 42_0a and 42_1a may be supplied with a noise voltage corresponding to a parasitic resistance R_pwell' via the P-type well region 42 surrounding the N-type well region 43. In this case, the length of the path via the P-type well region 42 is about the same as in the case of the second embodiment. Therefore, the parasitic resistance R_pwell' may be set to a value about the same as the parasitic resistance R_pwell.

With the above configuration, it is possible to prevent the influence of the noise voltage via the substrate between the analog circuit 42_0a and 42_1a to the same degree as in the second embodiment.

Further, in the above the P-type well region sandwiched between the circuit regions 43_0 and 43_1 on the N-type well, it may be affected by the noise voltage from both the analog circuits 42_0a and 42_1a. However, when the circuit is highly resistant to the noise voltage, like the digital circuit 42_d, it is possible to be operated without problems even above the P-type well region sandwiched between the circuit regions 43_0 and 43_1 on the N-type well. Further, the influence of the noise voltage due to the digital circuit 42_d on the analog circuits 42_0a and 42_1a is prevented by the circuit regions 43_0 and 43_1 on the N-type well. Therefore, it is possible to arrange the circuits without wasting in the region between the circuit regions 43_0 and 43_1 on the N-type well, and further, it is possible to prevent an increase in the circuit area.

Further, in FIGS. 16 and 17, descriptions have been made on the example in which two N-type well regions 43 are provided between the P-type well regions 42_0 and 42_1, but the present disclosure is not limited thereto. For example, between the P-type well regions 42_0 and 42_1, without being limited to two, n (n is an integer of 2 or more) N-type well regions 43 may be provided.

In this case, assuming that the sum of the widths of n N-type well regions 43 is a width W, regardless of the number of the N-type well region 43, it is possible to design to satisfy the described relational expression of $((2L+W/n*n)/W/n*n)=((2L+W)/W) \geq k$. That is, the width of each of the n N-type well regions 43 provided along the direction that connects the analog circuits 42_0a and 42_1a is designed to satisfy the relational expression. Therefore, in the N-type well region, the noise voltage between the analog circuits 42_0a and 42_1a may be reduced to be negligible in both the path propagating the P-type semiconductor substrate 41 and the path propagating on the P-type well region 42 by going around the N-type well region 43. Further, it is possible to shorten the distance between the analog circuits 42_0a and 42_1a as compared with the case where the analog circuits 42_0a and 42_1a are provided separately without providing the N-type well region 43.

2.5 Second Modification

In the second embodiment and the first modification of the second embodiment, descriptions have been made on the case where the two circuit regions 42_0 and 42_1 on the P-type well supplied with a voltage through wirings different from each other are provided along the X direction, the present disclosure is not limited thereto. For example, one of the two circuit regions 42_0 and 42_1 may surround the other circuit region.

Figure 18:
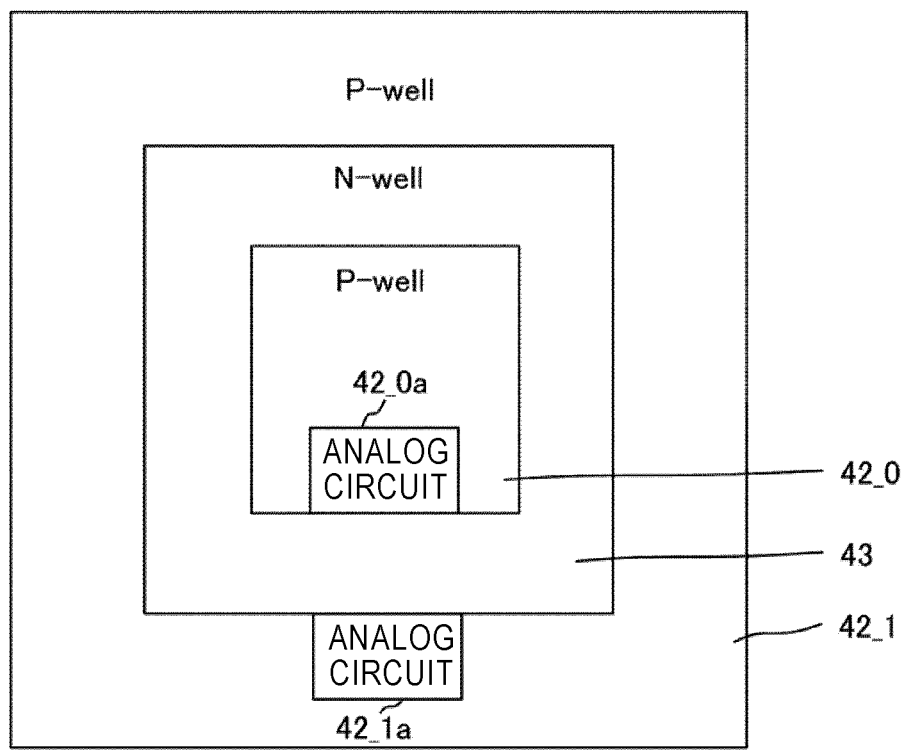
FIG. 18 is a schematic diagram for explaining a layout configuration of a substrate on which a semiconductor memory device according to a second modification of a second embodiment is provided.

FIG. 18 is a schematic diagram for explaining a layout configuration of a substrate on which a semiconductor memory device according to the second modification of the second embodiment is provided. FIG. 18 corresponds to (A) in FIG. 14 described in the second embodiment.

As illustrated in FIG. 18, the circuit regions 42_0 and 42_1 on the P-type well are formed separately from each other by the N-type well region 43. That is, the N-type well region 43 surrounds the circuit region 42_0 on the P-type well, and the circuit region 42_1 on the P-type well surrounds the N-type well region 43.

With the above configuration, the propagation path of the noise voltage between the analog circuits 42_0a and 42_1a may be only the path via the P-type semiconductor substrate 41. Accordingly, it is possible to reduce the noise voltage via the substrate.

3. Third Embodiment

Next, a semiconductor memory device according to a third embodiment will be described. In the semiconductor memory device according to the first embodiment, in the asynchronous operations, the case where the noise voltage involved in the various discharge corresponding to the different planes PB is reduced is described. However, the noise voltage may be propagated from one of the peripheral circuit group PERI to the other via the wiring commonly connected between the two peripheral circuit groups PERI. A semiconductor memory device according to the third embodiment, the case where the noise voltage propagating via a wiring that is able to supply a common voltage to a plurality circuits in the peripheral circuit group PERI is reduced will be described.

Figure 19:
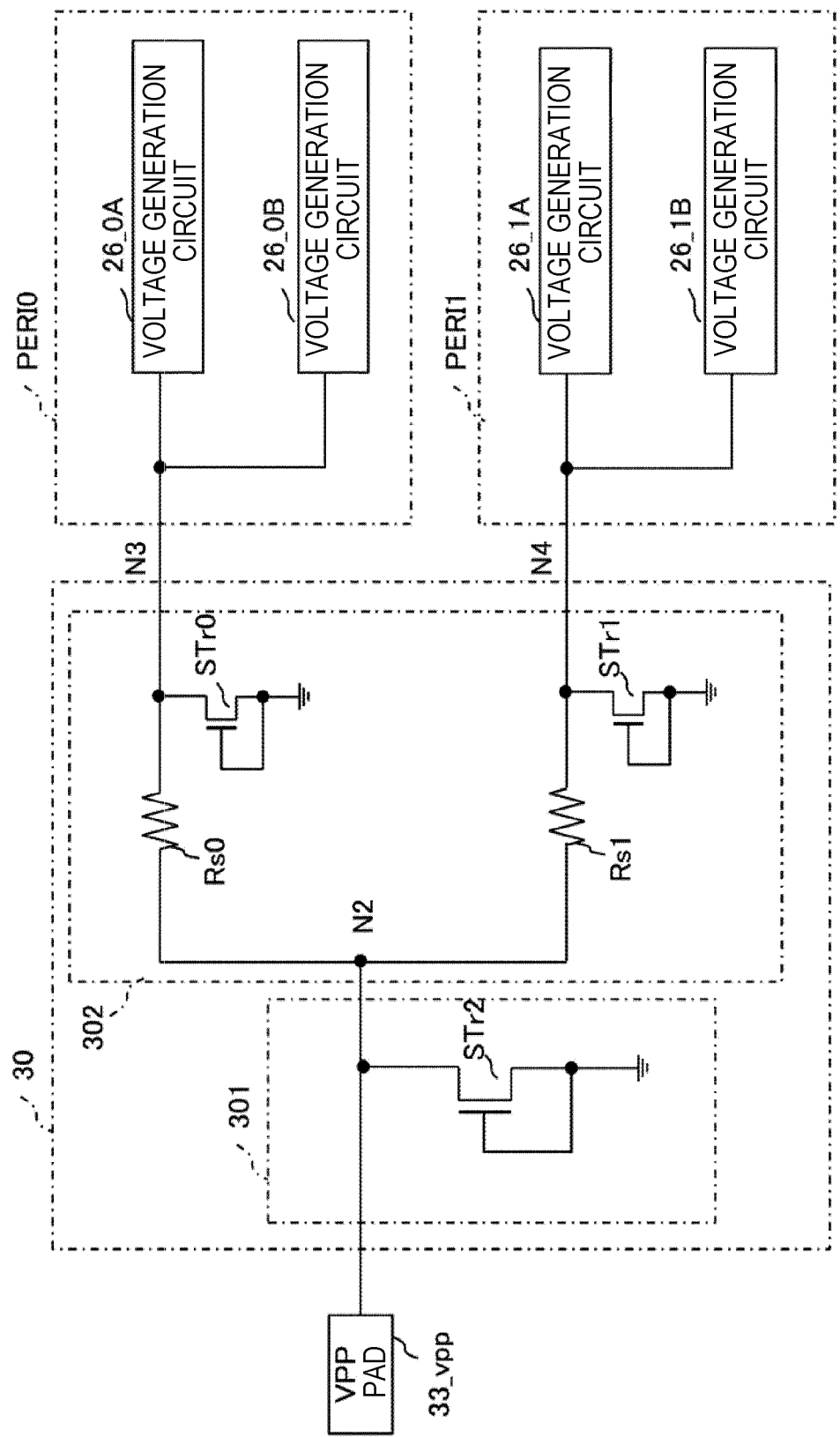
FIG. 19 is a circuit diagram for explaining a configuration of a voltage supply path via a power supply protection circuit to a peripheral circuit of a semiconductor memory device according to a third embodiment.

3.1 Configuration of Voltage Supply Path Via Power Supply Protection Circuit FIG. 19 is a circuit diagram for explaining a configuration of a voltage supply path via a power supply protection circuit to a peripheral circuit of a semiconductor memory device according to the third embodiment. In FIG. 19, as an example, a voltage supply path to the voltage generation circuit 26 in the peripheral circuit group PERI is schematically illustrated. More specifically, the supply path of the voltage VPP to the voltage generation circuits 26_0A and 26_0B in the peripheral circuit group PERI0 and to the voltage generation circuits 26_1A and 26_1B in the peripheral circuit group PERI1 is schematically illustrated.

As illustrated in FIG. 19, the power supply protection circuit 30 includes, for example, a first protection circuit 301 and a second protection circuit 302. The first protection circuit 301 includes a short-circuit transistor STr2. The second protection circuit 302 includes short-circuit transistors STr0 and STr1, and protection resistances Rs0 and Rs1.

The pad 33_vpp is connected to the node N2, and supplied the voltage VPP to the voltage generation circuits 26_0A, 26_0B, 26_1A, and 26_1B.

The short-circuit transistor STr2 includes a first end connected to the node N2, a grounded second end, and a gate. The short-circuit transistor STr2 has a function of protecting the peripheral circuit groups PERI0 and PERI1 from the influence of the surge by flowing a short-circuit current when the potential of the node N2 is greatly varied due to, for example, the surge or the like.

The short-circuit transistor STr0 includes a first end connected to the node N3, a grounded second end, and a gate. The short-circuit transistor STr0 has a function of protecting the voltage generation circuits 26_0A and 26_0B in the peripheral circuit group PERI0 from the influence of the surge by flowing a short-circuit current when the potential of the node N3 is greatly varied due to, for example, the surge or the like. The protection resistor Rs0 includes a first end connected to the node N2 and a second end connected to the node N3. The protection resistor Rs0 has a function of preventing an excessive increase in the short-circuit current flowing through the short-circuit transistor STr0.

The short-circuit transistor STr1 includes a first end connected to the node N4, a grounded second end, and a gate. The short-circuit transistor STr1 has a function of protecting the voltage generation circuits 26_1A and 26_1B in the peripheral circuit group PERI1 from the influence of the surge by flowing a short-circuit current when the potential of the node N4 is greatly varied due to, for example, the surge or the like. The protection resistor Rs1 includes a first end connected to the node N2 and a second end connected to the node N4. The protection resistor Rs1 has a function of suppressing an excessive increase in the short-circuit current flowing through the short-circuit transistor STr1. The resistance value of the protection resistance Rs1 is designed, for example, to be equal to the resistance value of the protection resistance Rs0, but an imbalance with the protection resistance Rs0 is caused due to factors, for example, manufacturing variations and layout asymmetry.

With the above configuration, a pair of the short-circuit transistor STr0 and the protection resistance Rs0 in the second protection circuit 302 corresponds to the peripheral circuit group PERI0, and a pair of the short-circuit transistor STr1 and the protection resistance Rs1 in the second protection circuit 302 corresponds to the peripheral circuit group PERI1, respectively. That is, the short-circuit transistor STr0, the protection resistance Rs0, and the peripheral circuit group PERI0 and the short-circuit transistor STr1, the protection circuit Rs1, and the peripheral circuit group PERI1 are connected to the node N2 in parallel. Therefore, the peripheral circuit groups PERI0 and PERI1 are connected via the node N2, but the protection resistances Rs0 and Rs1 are included between the paths. As a result, it is possible to prevent the propagation of noise from one of the peripheral circuit group PERI to the other, compared with the case where the protection resistances Rs0 and Rs1 are not included between the paths connecting the peripheral circuit groups PERI.

3.2 Voltage Supply Operation in Normal State

Figure 20:
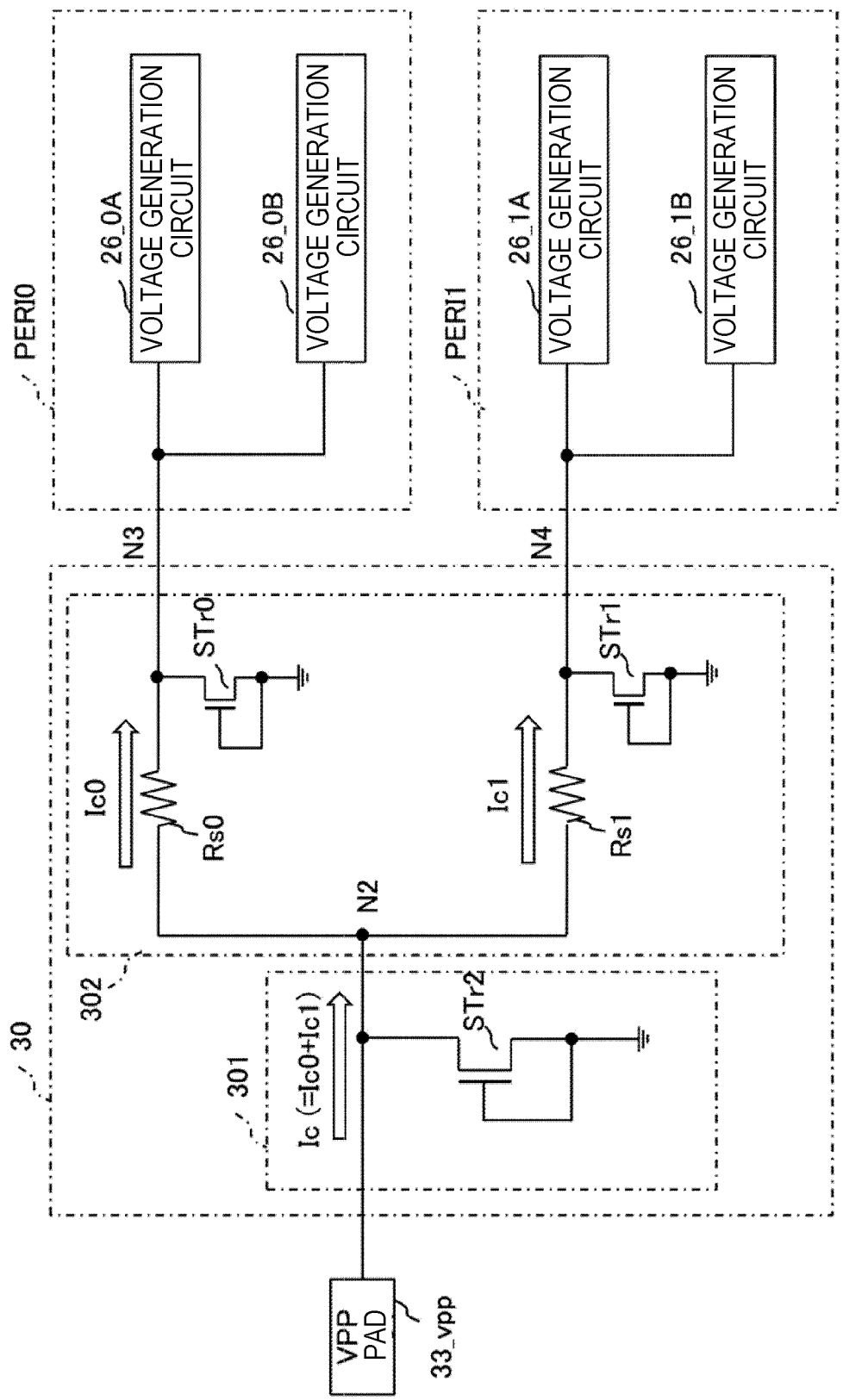
FIG. 20 is a schematic view for explaining a normal operation in a semiconductor memory device according to a third embodiment.

Next, an operation (hereinafter, also referred to as a "normal operation") when a voltage is normally supplied to the peripheral circuit in the semiconductor memory device according to the third embodiment will be described. FIG. 20 is a schematic view for explaining a normal operation in a semiconductor memory device according to the third embodiment. In an example of FIG. 20, a case where the power supply protection function by the short-circuit transistors STr0 to STr2 is not operated and the voltage VPP is stable supplied to the peripheral circuit groups PERI0 and PERI1 is illustrated as an example.

As illustrated in FIG. 20, a current Ic capable of supplying the voltage VPP to the peripheral circuit groups PERI0 and PERI1 flows to the node N2. Currents Ic0 and Ic1 corresponding to respective loads flow to the nodes N3 and N4, respectively. In this case, each of voltage drop amounts in the protection resistances Rs0 and Rs1 is smaller than voltage drop amounts in a case in which the current Ic (=Ic0+Ic1) flows to the protection resistances Rs0 and Rs1. Therefore, it is possible to prevent an increase in the voltage drop amount due to the protection resistance as compared with a configuration in which a pair of one protection resistance and a short-circuit transistor is allocated to the peripheral circuit groups PERI0 and PERI1, and further, it is possible to efficiently use the voltage supplied from the pad 33_vpp.

3.3 Power Supply Protection Operation at Surge Occurrence

Figure 21:
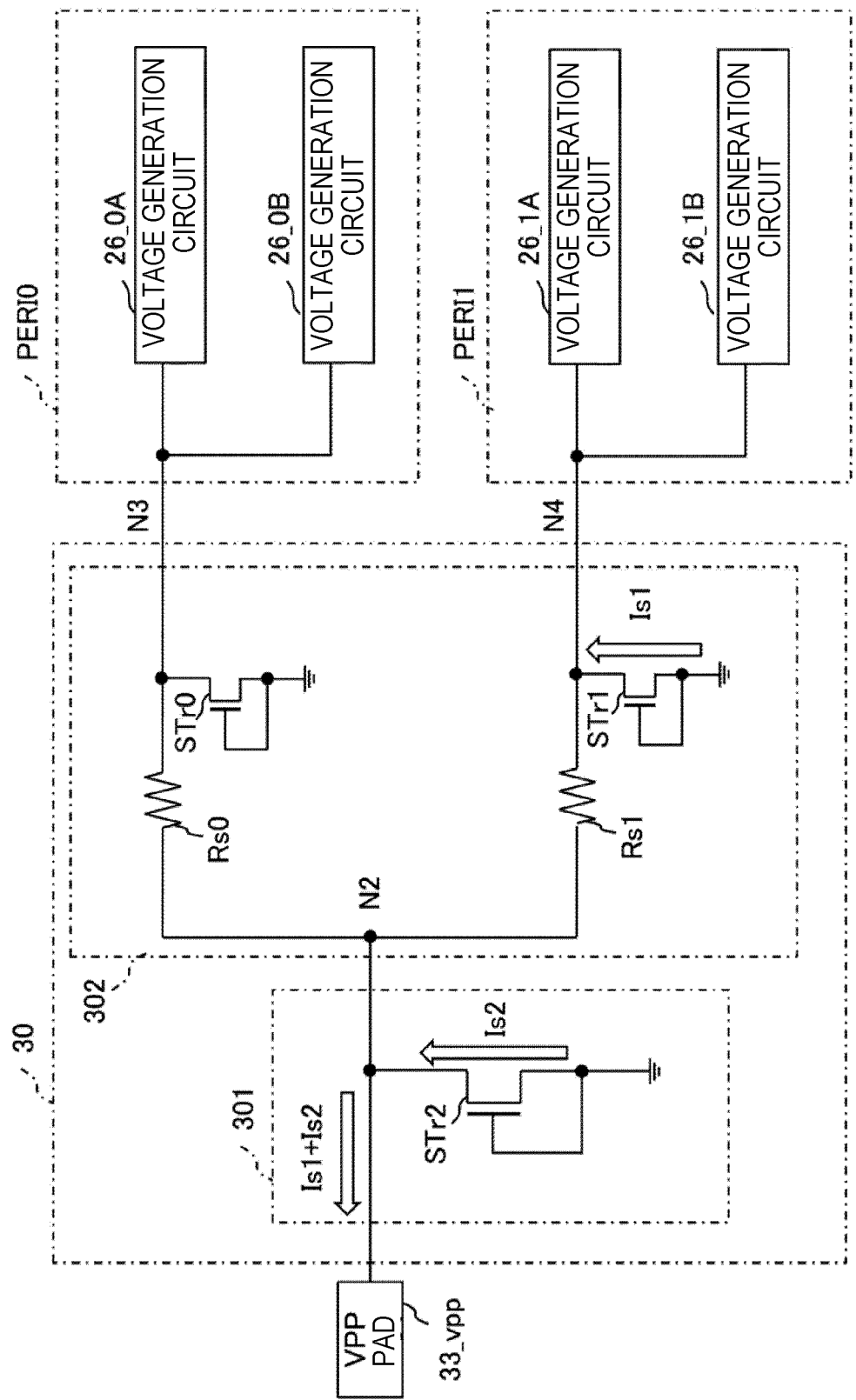
FIG. 21 is a schematic view for explaining a power supply protection operation by a power supply protection circuit in a semiconductor memory device according to a third embodiment.

FIG. 21 is a schematic view for explaining a power supply protection operation by a power supply protection circuit in a semiconductor memory device according to the third embodiment. In an example of FIG. 21, it is assumed that an imbalance occurs in a load resistance of the parallelized paths when viewed from the pad 33_vpp due to the factors such as variations in manufacturing states. That is, in FIG. 21, the power protection operation in a case where the load resistance including the peripheral circuit group PERI1 and the protection resistance Rs1 is smaller than the load resistance including the peripheral circuit group PERI0 and the protection resistance Rs0 is illustrated. Further, in FIG. 21, for convenience of explanation, as an example of the surge, a flow of current when a negative voltage is applied to the pad 33_vpp is illustrated.

As illustrated in FIG. 21, when a surge occurs in the voltage supplied from the pad 33_vpp, the short-circuit transistor STr2 goes into an ON state, and a current Is2 flows to the node N2 via the short-circuit transistor STr2.

Further, as described above, in the example of FIG. 21, the peripheral circuit group PERI1 has a smaller load resistance than the peripheral circuit group PERI0. Therefore, an imbalance in the load resistance occurs in the path from the node N2 passing through the protection resistance Rs0 and in the path from the node N2 passing through the protection resistance Rs1. As a result, when a steep voltage variation such as a surge occurs, a current selectively flows only to the path having a smaller load resistance (that is, in the example of FIG. 21, the path passing through the node N4). Thus, the short-circuit transistor STr1 goes into an ON state and a current Is1 flows to the node N4 via the shout-circuit transistor STr1. Meanwhile, the short-circuit transistor STr0 is remained in an OFF state and a current does not flow to the node N3. As a result, in the pad 33_vpp, the peripheral circuit groups PERI0 and PERI1 are protected by the sum Is1+Is2) of the current Is1 flowing through the short-circuit transistor STr1 and the current Is2 flowing through the short-circuit transistor STr2.

By operating as described above, only the protection resistance Rs1 is able to be used as a protection resistance through which a current for protecting power supply flow when the surge occurs. Therefore, it is possible to have a resistance value of the effective protection resistance at the time of surge larger than the resistance value at the normal operation, as compared with the case where the current flows through both of the protection resistances Rs0 and Rs1, and further, it is possible to prevent an increase in the current flowing at surge occurrence. Further, when a surge occurs due to application of a positive voltage to the pad 33_vpp, the current direction is reversed, so that it is possible to prevent an increase in the current flowing at the time of surge occurrence as the same as the described example.

3.4 Effect of Embodiment

According to the third embodiment, two protection circuits (a pair of the protection resistance Rs0 and the short-circuit transistor STr0 and a pair of the protection resistance Rs1 and the short-circuit transistor STr1) are connected in parallel to one pad 33_vpp. Therefore, in normal state, it is possible to make the value of the protection resistance smaller than in a case where one protection circuit is connected to one pad.

In addition, an imbalance occurs due to factors such as manufacturing variations in the load resistance of the peripheral circuit group PERI0 and the protection resistance Rs0, and the load resistance of the peripheral circuit group PERI1 and the protection resistance Rs1. Therefore, when a surge occurs, a current flows only through a path having a smaller load resistance between the two paths (a path via the protection resistance Rs0 and a path via the protection resistance Rs1) connected to the node N2. As a result, it is possible to prevent an increase in a current amount flowing at surge occurrence.

In addition, the peripheral circuit groups PERI0 and PERI1 are connected to each other via the protection resistances Rs0 and Rs1. Therefore, due to the asynchronous operations of the peripheral circuit groups PERI0 and PERI1, when the noise voltage propagates from one of the peripheral circuit group to the other, the influence of the noise voltage may be alleviated by the protection resistances Rs0 and Rs1. Therefore, it is possible to reduce noise between the planes that operate asynchronously.

3.5 First Modification

Further, in the third embodiment, descriptions have been made on the case where the protection circuits are parallelized between the peripheral circuit groups PERI0 and PERI1 that operate asynchronously, but the present disclosure is not limited thereto. For example, the protection circuit may be parallelized between circuits provided in the same peripheral circuit group PERI.

Figure 22:
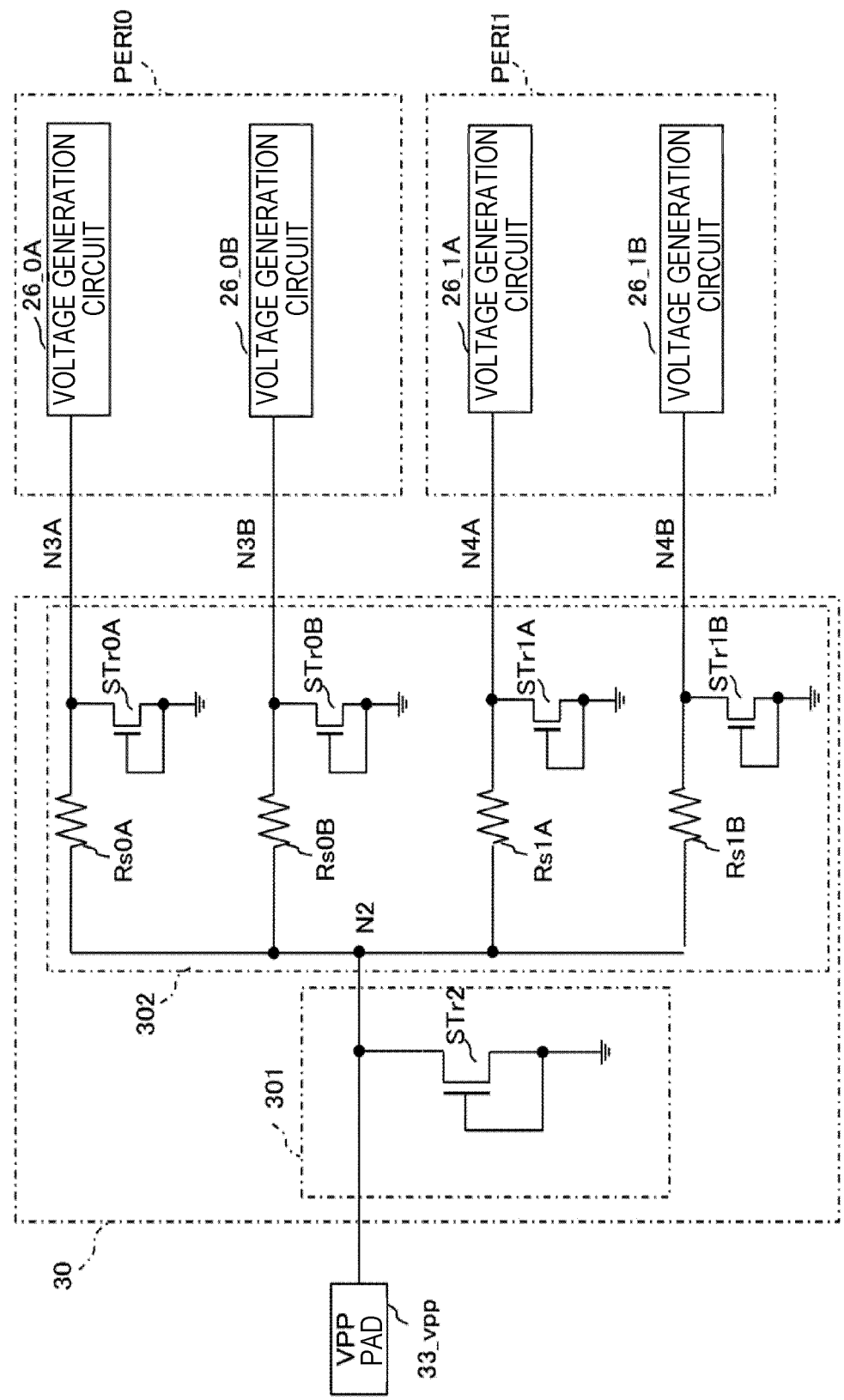
FIG. 22 is a circuit diagram for explaining a configuration of a voltage supply path via a power supply protection circuit to a peripheral circuit of a semiconductor memory device according to a first modification of a third embodiment.

FIG. 22 is a circuit diagram for explaining a configuration of a voltage supply path via a power supply protection circuit to a peripheral circuit of a semiconductor memory device according to a first modification of the third embodiment.

As illustrated in FIG. 22, the second protection circuit 302 includes protection resistances Rs0A, Rs0B, Rs1A, and Rs1B, and short-circuit transistors STr0A, STr0B, STr1A, and STr1B.

The short-circuit transistor STr0A includes a first end connected to a node N3A, a grounded second end, and a gate. The short-circuit transistor STr0A has a function of protecting a voltage generation circuit 26_0A in the peripheral circuit group PERI0 from the influence of the surge by flowing a short-circuit current when the potential of the node N3A is greatly varied due to, for example, the surge or the like. The protection resistor Rs0A includes a first end connected to the node N2 and a second end connected to the node N3A. The protection resistor Rs0A has a function of preventing an excessive increase in the short-circuit current flowing through the short-circuit transistor STr0A.

The short-circuit transistor STr0B includes a first end connected to a node N3B, a grounded second end, and a gate. The short-circuit transistor STr0B has a function of protecting a voltage generation circuits 26_0B in the peripheral circuit group PERI0 from the influence of the surge by flowing the short-circuit current when the potential of the node N3B is greatly varied due to, for example, the surge or the like. The protection resistor Rs0B includes a first end connected to the node N2 and a second end connected to the node N3B. The protection resistor Rs0B has a function of preventing an excessive increase in the short-circuit current flowing through the short-circuit transistor STr0B.

The short-circuit transistor STr1A includes a first end connected to a node N4A, a grounded second end, and a gate. The short-circuit transistor STr1A has a function of protecting a voltage generation circuit 26_1A in the peripheral circuit group PERI1 from the influence of the surge by flowing the short-circuit current when the potential of the node N4A is greatly varied due to, for example, the surge or the like. The protection resistor Rs1A includes a first end connected to the node N2 and a second end connected to the node N4A. The protection resistor Rs1A has a function of preventing an excessive increase in the short-circuit current flowing through the short-circuit transistor STr1A.

The short-circuit transistor STr1B includes a first end connected to a node N4B, a grounded second end, and a gate. The short-circuit transistor STr1B has a function of protecting a voltage generation circuit 26_1B in the peripheral circuit group PERI1 from the influence of the surge by flowing the short-circuit current when the potential of the node N4B is greatly varied due to, for example, the surge or the like. The protection resistor Rs1B includes a first end connected to the node N2 and a second end connected to the node N4B. The protection resistor Rs1B has a function of preventing an excessive increase in the short-circuit current flowing through the short-circuit transistor STr1B.

With the above configuration, a pair of the short-circuit transistor STr0A and the protection resistance Rs0A and a pair of the short-circuit transistor STr0B and the protection resistance Rs0B in the second protection circuit 302 are corresponded by one-to-one to the voltage generation circuits 26_0A and 26_0B in the peripheral circuit group PERI0, respectively. Further, a pair of the short-circuit transistor STr1A and the protection resistance Rs1A and a pair of the short-circuit transistor STr1B and the protection resistance Rs1B are corresponded by one-to-one to the voltage generation circuits 26_1A and 26_1B in the peripheral circuit group PERI1, respectively.

That is, the nodes N3A, N3B, N4A, and N4B are connected in parallel to the node N2. Therefore, noise between circuits that operate asynchronously may be reduced not only between the other peripheral circuit groups PERI0 and PERI1, but also between different circuits in the same peripheral circuit group PERI. Further, it is possible to make the resistance value of the protection resistance in normal state smaller than the case where one protection circuit is connected to one pad, and it is also possible to prevent an increase in a current amount flowing at the surge occurrence.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first power supply protection circuit and a second power supply protection circuit; and
a pad electrically connected to a first node to supply a first voltage from an outside to the first node, wherein
the first power supply protection circuit includes:
a first resistor including a first end electrically connected to the first node and a second end electrically connected to a second node; and
a first transistor that is controlled to supply a second voltage different from the first voltage to the second node,
the second power supply protection circuit includes:
a second resistor including a first end electrically connected to the first node and a second end electrically connected to a third node; and
a second transistor that is controlled to supply the second voltage to the third node.

2. The semiconductor memory device according to claim 1, further comprising:
a first peripheral circuit including an input end electrically connected to the second node, and
a second peripheral circuit including an input end electrically connected to the third node, and
wherein a load resistance of the first peripheral circuit is different from a load resistance of the second peripheral circuit.

3. The semiconductor memory device according to claim 2, further comprising:
a first memory cell and a second memory cell, and
a control circuit,
wherein the control circuit is configured to execute a first read operation for reading data from the first memory cell using the first peripheral circuit, and a second read operation for reading data from the second memory cell asynchronously with the first read operation using the second peripheral circuit in parallel.

4. The semiconductor memory device according to claim 1, further comprising:
a third power supply protection circuit including a third resistor including a first end electrically connected to the first node and a second end electrically connected to a fourth node; and
a fourth power supply protection circuit including a fourth resistor including a first end electrically connected to the first node and a second end electrically connected to a fifth node.

5. The semiconductor memory device according to claim 4, further comprising:
a first peripheral circuit including an input end electrically connected to the second node,
a second peripheral circuit including an input end electrically connected to the third node,
a third peripheral circuit including an input end electrically connected to the fourth node, and
a fourth peripheral circuit including an input end electrically connected to the fifth node.

6. The semiconductor memory device according to claim 5,
wherein load resistances of the first, second, third, and fourth peripheral circuits are different from each other.

7. The semiconductor memory device according to claim 1, wherein each of the first transistor and the second transistor includes:
a gate,
a first terminal electrically connected to the first node and
a second terminal supplied with the second voltage and electrically connected to the gate.

8. The semiconductor memory device according to claim 7,
wherein the first resistor and the second resistor have different resistances.

9. A semiconductor memory device comprising:
a pad electrically connected to a first node to supply a first voltage from an outside to the first node, wherein
a primary power supply protection circuit including:
a first transistor having a gate and two terminals, one terminal being electrically connected to the first node, the other terminal being electrically connected to the gate of the first transistor and supplied with a second voltage lower than the first voltage,
a first secondary power supply protection circuit including:
a first resistor including two ends, one end being electrically connected to the first node, the other end being electrically connected to a second node, and
a second transistor having a gate and two terminals, one terminal being electrically connected to the second node, the other terminal being electrically connected to the gate of the second transistor and supplied with the second voltage;
a second secondary power supply protection circuit including:
a second resistor including two ends, one end being electrically connected to the first node, the other end being electrically connected to a third node, and
a third transistor having a gate and two terminals, one terminal being electrically connected to the third node, the other terminal being electrically connected to the gate of the third transistor and supplied with the second voltage;
a first peripheral circuit including an input end electrically connected to the second node;
a second peripheral circuit including an input end electrically connected to the third node; and
a control circuit configured to execute
a first read operation to read data from a first memory cell using the first peripheral circuit, and
a second read operation to read data from the second memory cell using the second peripheral circuit.

* * * * *